(12) United States Patent
Bachrach

(10) Patent No.: US 6,540,466 B2
(45) Date of Patent: *Apr. 1, 2003

(54) COMPACT APPARATUS AND METHOD FOR STORING AND LOADING SEMICONDUCTOR WAFER CARRIERS

(75) Inventor: Robert Z. Bachrach, Palo Alto, CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/350,867

(22) Filed: Jul. 9, 1999

(65) Prior Publication Data

US 2002/0071744 A1 Jun. 13, 2002

Related U.S. Application Data

(63) Continuation-in-part of application No. 08/764,661, filed on Dec. 11, 1996, now Pat. No. 5,957,648.

(51) Int. Cl.[7] ................................................. B65G 1/12
(52) U.S. Cl. ..................... 414/217; 414/940; 414/939; 414/222.11; 414/236; 414/331.01; 414/331.14; 414/217.1; 118/719
(58) Field of Search .................. 118/719; 414/940, 414/935, 937, 938, 331.14, FOR 331, 331.18, 331.15, 331.01, 939, 217, 217.1, 416, 417, 236, 237, 222.07, 222.01, 222.08, 222.11, 226.05

(56) References Cited

U.S. PATENT DOCUMENTS

| | | | |
|---|---|---|---|
| 3,610,445 A | | 10/1971 | Kitchen et al. |
| 4,047,624 A | * | 9/1977 | Dorenbos ............... 414/939 X |
| 4,615,430 A | | 10/1986 | Satoh |
| 4,826,360 A | * | 5/1989 | Iwasawa et al. ........ 414/940 X |
| 4,851,018 A | * | 7/1989 | Lazzari et al. .......... 414/940 X |
| 4,904,153 A | | 2/1990 | Iwasawa et al. |
| 4,937,690 A | * | 6/1990 | Yamashita et al. ............ 360/92 |
| 4,981,408 A | | 1/1991 | Hughes et al. |
| 5,048,164 A | | 9/1991 | Harima |
| 5,261,935 A | | 11/1993 | Ishii et al. |

(List continued on next page.)

FOREIGN PATENT DOCUMENTS

| | | | | |
|---|---|---|---|---|
| EP | 0 675 523 A2 | | 10/1995 | |
| JP | 17006 | | 1/1993 | |
| JP | 405017006 | * | 1/1993 | ................. 414/940 |
| JP | 132186 | | 1/1994 | |
| JP | 406132186 | * | 5/1994 | ................. 414/940 |
| WO | WO 98/46503 | | 10/1998 | |

OTHER PUBLICATIONS

"Infab Universal Load Ports" 1995 Infab.
"Erect–A–Line" Middlesex Industries.

*Primary Examiner*—Frank E. Werner
(74) *Attorney, Agent, or Firm*—Dugan & Dugan LLP

(57) ABSTRACT

An improved apparatus and method is provided for storing semiconductor wafer carriers, and for loading wafers or wafer carriers to a fabrication tool. The apparatus preferably provides an elevated port for receipt of wafer carriers from an overhead factory transport, allows for local interconnection among a plurality of the inventive apparatuses, and enables independent loading of the factory load port and the tool load port. An inventive wafer handling method which divides a lot of wafers into sublots and distributes the sublots among tools configured to perform the same process is also provided.

24 Claims, 21 Drawing Sheets

U.S. PATENT DOCUMENTS

| | | |
|---|---|---|
| 5,363,867 A | 11/1994 | Kawano et al. |
| 5,391,035 A | 2/1995 | Krueger |
| 5,399,531 A | 3/1995 | Wu |
| 5,425,611 A * | 6/1995 | Hughes et al. .......... 414/940 X |
| 5,462,397 A | 10/1995 | Iwabuchi |
| 5,464,313 A | 11/1995 | Ohsawa |
| 5,468,112 A * | 11/1995 | Ishii et al. .............. 414/217 X |
| 5,527,390 A | 6/1996 | Ono et al. |
| 5,536,128 A | 7/1996 | Shimoyashiro et al. |
| 5,562,383 A | 10/1996 | Iwai et al. |
| 5,570,990 A | 11/1996 | Bonora et al. |
| 5,586,585 A | 12/1996 | Bonora et al. |
| 5,603,777 A * | 2/1997 | Ohasi ..................... 414/940 X |
| 5,628,604 A | 5/1997 | Murata et al. |
| 5,655,869 A | 8/1997 | Scheier et al. |
| 5,788,448 A | 8/1998 | Wakamori et al. |
| 5,829,939 A * | 11/1998 | Iusai et al. .............. 414/940 X |
| 5,957,648 A * | 9/1999 | Bachrach .................... 414/217 |
| 5,980,183 A | 11/1999 | Fosnight |

* cited by examiner

COMPACT APPARATUS AND METHOD FOR STORING AND LOADING SEMICONDUCTOR WAFER CARRIERS

This application is a continuation-in-part of U.S. patent application Ser. No. 08/764,661, now U.S. Pat. No. 5,957,648 filed Dec. 11, 1996.

FIELD OF THE INVENTION

The present invention relates generally to semiconductor wafer fabrication systems, and to an improved method and apparatus for storing and loading semiconductor wafer carriers at a given semiconductor wafer fabrication tool.

BACKGROUND

The drive for reduced cost per unit wafer processed characterizes the semiconductor industry. Thus the semiconductor industry continuously searches for ways to increase wafer output and/or reduce overall equipment costs (costs of ownership). Among the factors significantly affecting cost of ownership for a given piece of equipment are clean room costs, footprint and labor costs. It is well recognized that overall semiconductor wafer fabrication system (i.e., fabrication tool) productivity increases are achieved by ensuring a constant supply of wafers at each tool. Conventionally this has been accomplished by employing a local buffer supply (i.e., a supply of wafers at the tool). For example, the "MINI BUFFER" marketed by Jenoptik/Infab is a vertical buffer which is positioned near a fabrication tool's load lock chambers. The MINI BUFFER comprises a series of vertically arranged shelves and one or more load ports for access by the tool's loader robot, and/or for access by factory transport agents (i.e., the mechanism that transfers wafer carriers from the factory to the buffer apparatus' factory load port). Conventionally one MINI BUFFER is positioned near each load lock, a distance from the load lock sufficient to accommodate the axis of rotation of a front loader robot. The loader robot may then access either MINI BUFFER to obtain a wafer carrier for loading to either load lock. Although such methods maintain a constant local buffer supply of wafer carriers, they occupy a considerable amount of floor space thus increasing the system's cost of ownership. The fact that fabrication tools are frequently maintained in a clean room environment further exacerbates the increased cost associated with the system's larger footprint.

In addition, most prior art systems do not allow simultaneous access by the tool loader and the factory transport agent, and thereby complicate factory transport scheduling, and can result in throughput reduction.

Accordingly, there is a need for apparatuses and methods which can reduce footprint and/or increase machine/factory throughput.

SUMMARY OF THE PREFERRED EMBODIMENTS

In its broadest aspect the invention comprises a load/buffer adapted to provide local storage of wafer carriers at a fabrication tool, the load/buffer comprising a first factory load port adapted to receive wafer carriers to be transferred to and from the factory, a wafer carrier store, a first wafer carrier transfer mechanism adapted to transfer wafer carriers between the factory load port and the store, a first tool load port adapted to receive wafer carriers to be accessed by a fabrication tool, and a second wafer carrier transfer mechanism adapted to transfer wafer carriers between the tool load port and the store.

The wafer carrier store may comprise for example, a shelf, shelves, or a conveyor, and the wafer carrier transfer mechanisms may comprise for example, a shelf capable of raising or lowering the wafer carrier between the wafer carrier store and the load port (in which case rollers, a wafer handler or the like may transfer the wafer carrier between the shelf and the wafer carrier store), or a wafer handler capable of transferring the wafer carriers between the port and the store. The ports may be positioned at the height set by SEMI standard E15, or may be at a height greater than that of the fabrication tool, etc. The inventive apparatus may be positioned in front of the fabrication tool, beside the fabrication tool, at least partially above the fabrication tool, etc.

To enhance throughput, a plurality of load buffers may be connected so that one fabrication tool can receive a wafer carrier from the wafer carrier store of another fabrication tool if necessary. As used herein, the term "fabrication tool" includes any tool that performs a process on a substrate, whether it be deposition, etch, heat treatment, polish, clean, etc.

To further enhance throughput an inventive wafer handling method may be employed. The inventive wafer handling method increases throughput during any non-steady-state processing period (startup, tool failure, etc.), by dividing the wafers contained in a wafer carrier among a plurality of fabrication tools that are adapted to perform the same process. In this manner, each fabrication tool can immediately begin processing wafers, and throughput is greatly increased as compared to conventional methods which allow the entire wafer carrier full of wafers to remain with a single fabrication tool. Such conventional methods force the remaining fabrication tools to idle until a wafer carrier has arrived for each fabrication tool. Because most conventional fabrication systems deliver only one wafer carrier per hour, the inventive method results in a substantial increase in throughput. Although the inventive wafer handling method is most advantageously employed within a plurality of connected load buffers, such as those described herein, it may be used within any system containing a plurality of fabrication tools which perform the same process.

Other objects, features and advantages of the present invention will become more fully apparent from the following detailed description of the preferred embodiments, the appended claims and the accompanying drawings.

DETAILED DESCRIPTION OF THE DRAWINGS

Figure 1:
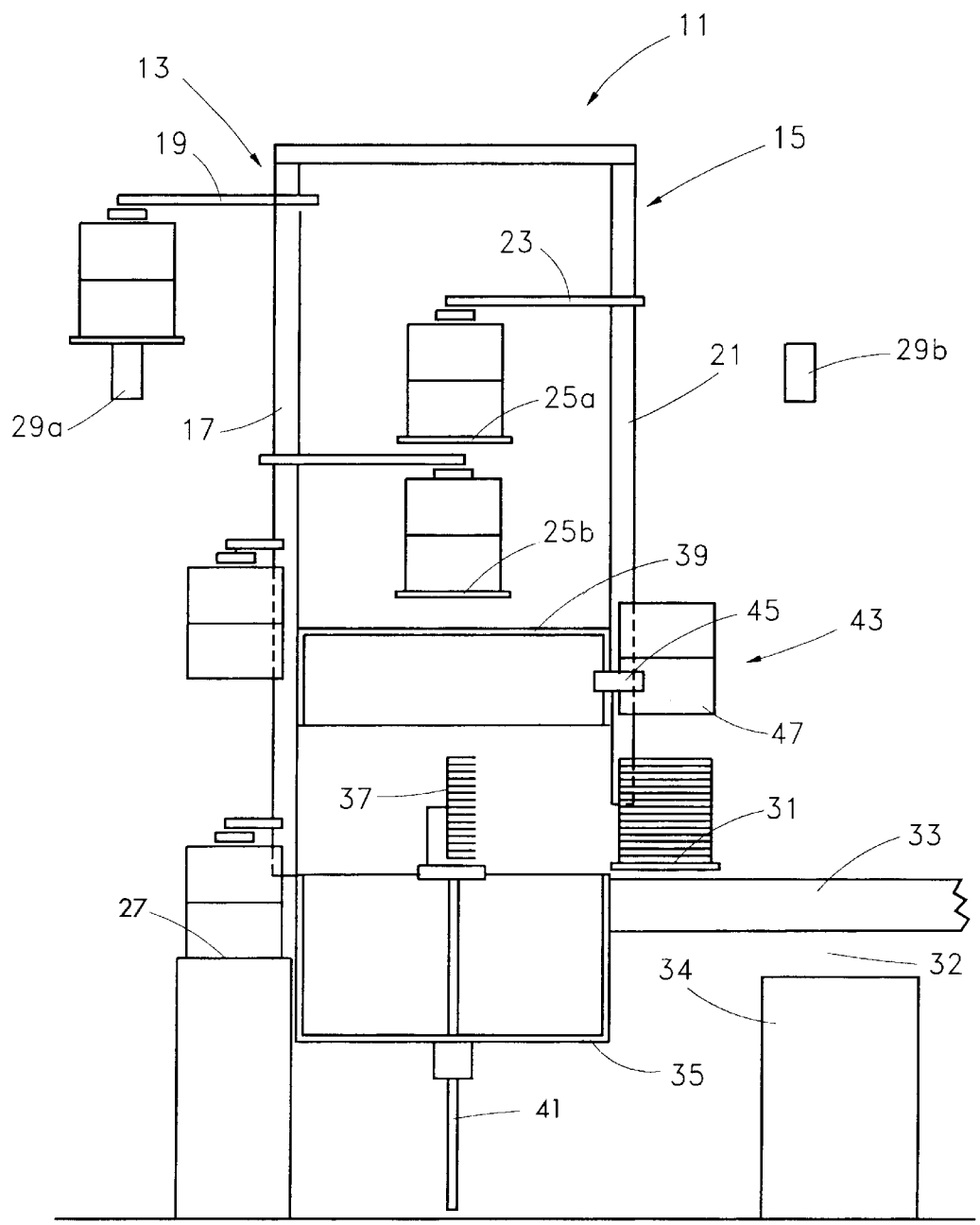
FIG. 1 is a side view of shelf-type load buffer of the invention.

FIG. 1 is a side view of an inventive load buffer 11. The load buffer 11 comprises a first and second vertical transfer mechanism comprised of a first robot 13 and a second robot 15, respectively. The first robot 13 comprises a first y-axis component 17 and a first x-axis component 19 movably coupled to the first y-axis component 17 such that the first x-axis component 19 may travel along the length of the first y-axis component 17. Similarly, the second robot 15 comprises a second y-axis component 21 and a second x-axis component 23 movably coupled to the second y-axis component 21 such that the second x-axis component 23 may travel along the length of the second y-axis component 21. Operatively coupled between the first robot 13 and the second robot 15 are one or more storage locations 25a, 25b.

The first robot 13 is configured such that when the first x-axis component 19 is at the lower portion of the first y-axis component 17 it may access a first load port 27 (preferably a SEMI E15 type load port) and such that when the first x-axis component 19 is at the upper portion of the first y-axis component 17 it may access a first overhead load port (not shown) which provides access to a first overhead wafer carrier transport system such as a monorail, referenced generally by the numeral 29a of FIG. 1.

The second robot 15 is configured such that when the second x-axis component 23 is at the lower portion of the second y-axis component 21 it may access a first wafer exchange port 31 and, optionally, such that when the second x-axis component 23 is at the upper portion of the second y-axis component 23 it may access an optional second overhead load port which provides access to a second overhead wafer carrier transport system such as a monorail, referenced generally by the numeral 29b in FIG. 1. Both the first x-axis component 19 and the second x-axis component 23 are configured so as to reach any of the storage locations 25a, 25b. In a preferred embodiment, each load port, each overhead load port and each wafer exchange port may simply comprise a predetermined location.

The first wafer exchange port 31 is preferably located substantially or completely above a fabrication tool 33 having at least a transfer chamber 32, a process chamber 34 and a first load lock 35. Most preferably the first wafer exchange port 31 is located above the transfer chamber 32 of the fabrication tool 33. Alternatively, however, the wafer exchange port 31 may occupy other locations. The first wafer exchange port 31 is operatively coupled to the first load lock 35 via a first loader mechanism referenced generally by the numeral 37 of FIG. 1. The first loader mechanism 37 comprises a wafer cassette platform such as that described in co-pending U.S. application Ser. No. 08/763,604 now U.S. Pat. No. 5,833,426 (the entire disclosure of which is incorporated herein by reference) that extends outside the open load lock 35 to extract wafers from a cassette located on the first wafer exchange port 31. The first load lock 35 has a first lid 39 and a lift-lower mechanism 41.

In the present invention the first loader mechanism 37 is positioned on lift-lower mechanism 41. When the first lid 39 and the lift-lower mechanism 41 are in their elevated positions, as shown in FIG. 1, the first loader mechanism 37 extends horizontally, extracts one or more wafers from a first wafer carrier 43 (or, alternatively, can transfer the entire wafer carrier) located on the first wafer exchange port 31 and retracts carrying the extracted wafers (or the entire cassette) into position on the lift-lower mechanism 41. The lift-lower mechanism 41 then lowers the wafers (or the cassette) as the first lid 39 lowers.

Further, in a preferred embodiment the first lid 39 has a wafer carrier-engaging mechanism referenced generally by the numeral 45 of FIG. 1 which will engage a second lid 47 of a first wafer carrier 43 located on the first wafer exchange port 31 causing the second lid 47 to elevate as the first lid 39 elevates. Thus, as shown in FIG. 1, the first wafer carrier 43 is open and ready for the first loader mechanism 37 to extract wafers for loading to the first load lock 35.

Figure 2:
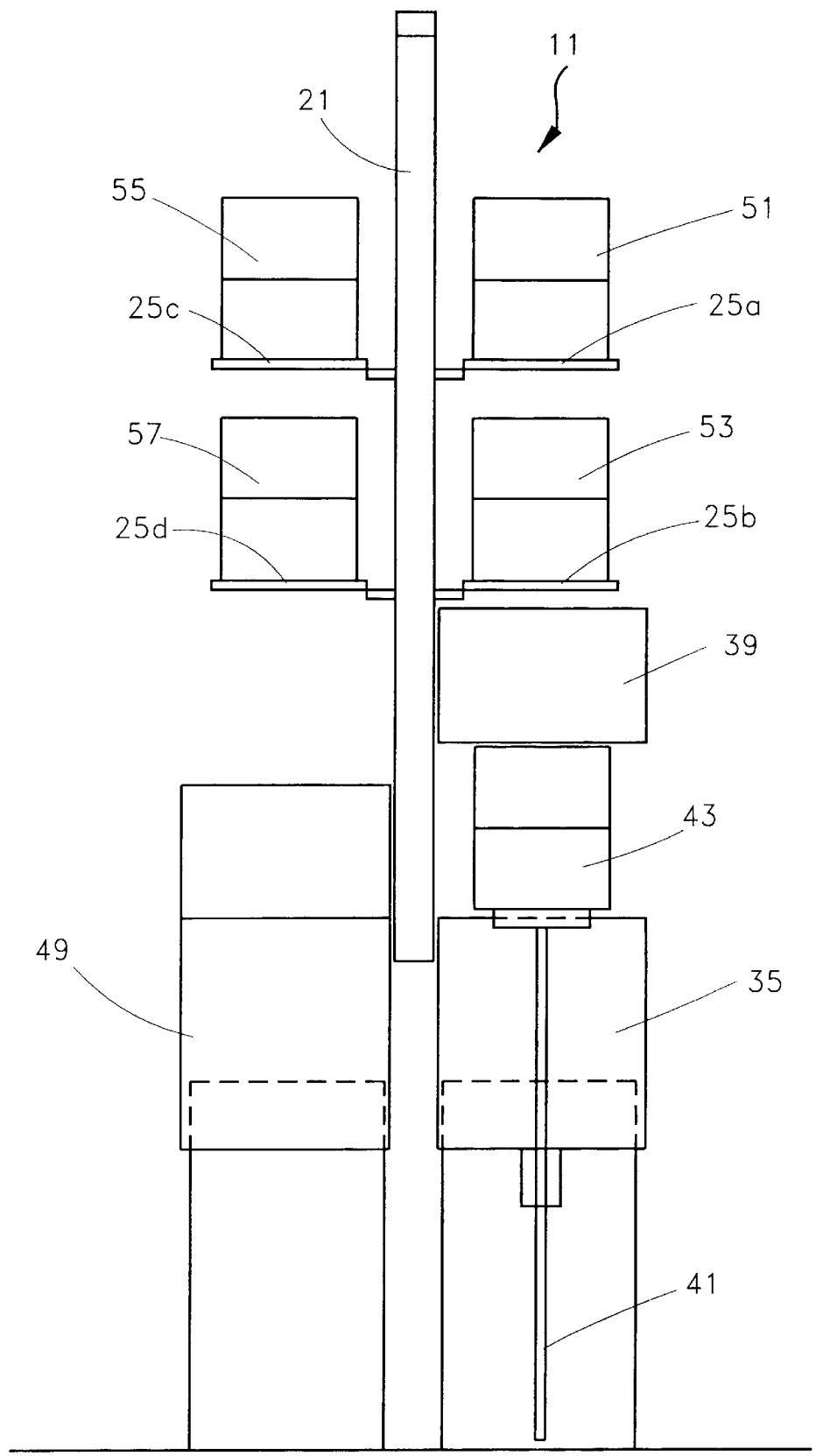
FIG. 2 is a front elevational view of the load buffer of FIG. 1 which shows a preferred arrangement of four storage locations.

FIG. 2 is a front elevational view of the load buffer 11 of FIG. 1 which shows a preferred arrangement of four storage locations 25a, 25b, 25c, and 25d, above the first load lock 35 and a second load lock 49. As shown in FIG. 2, the first load lock 35 is open with the first lid 39 elevated and the first wafer carrier 43 loaded on the lift-lower mechanism 41 for subsequent lowering into the first load lock 35. A second wafer carrier 51, a third wafer carrier 53, a fourth wafer carrier 55 and a fifth wafer carrier 57 are in storage on the storage locations 25a, 25b, 25c and 25d, respectively.

Figure 3:
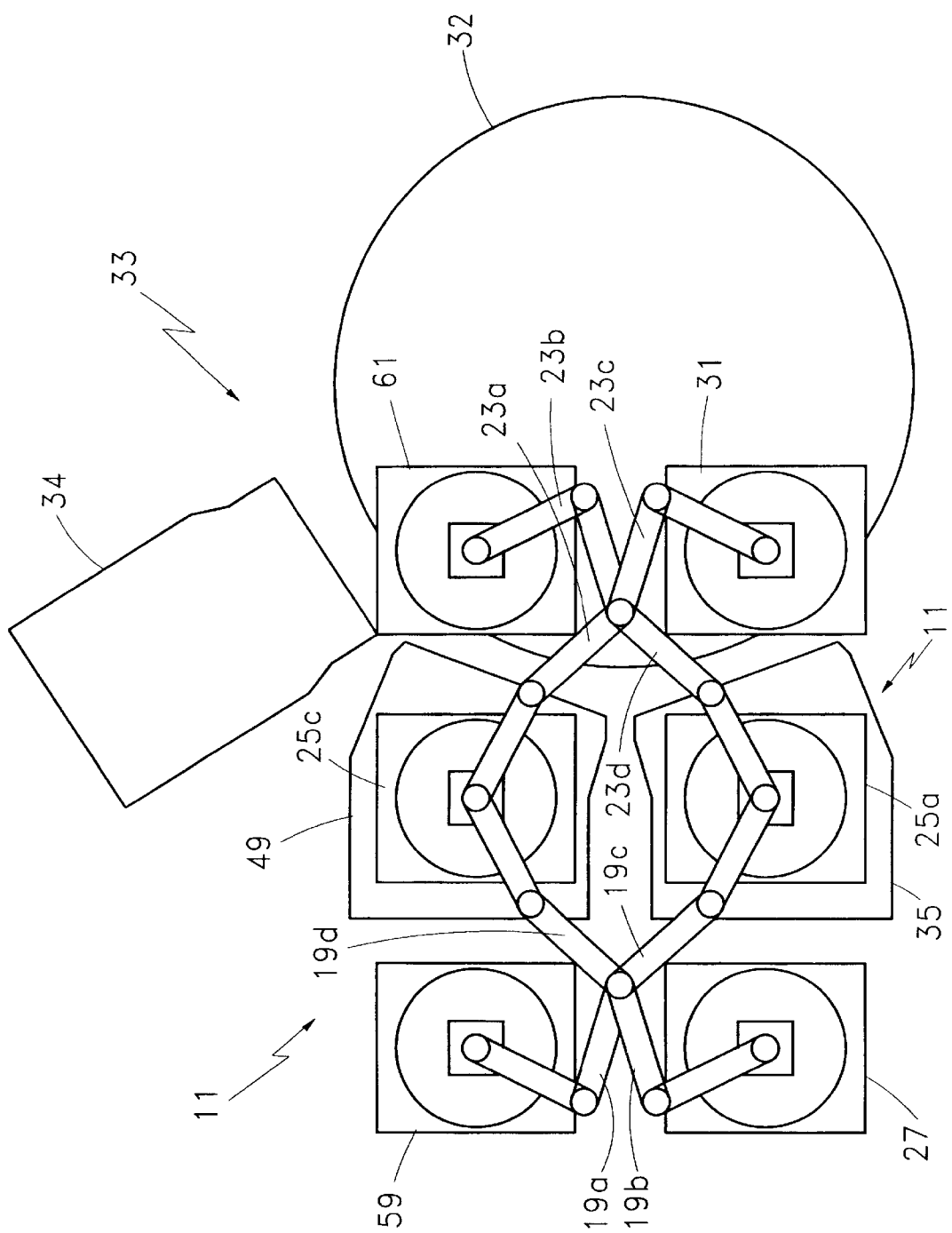
FIG. 3 is a top plan view of the load buffer of FIG. 1 which shows a preferred footprint thereof.

FIG. 3 is a top plan view of the load buffer 11 of FIGS. 1 and 2 which shows a preferred footprint of the load buffer 11, and which shows in pertinent part, a preferred footprint of the local area semiconductor wafer fabrication system. The four primary horizontal positions of the first x-axis component 19 and of the second x-axis component 23 are represented as 19a, 19b, 19c, and 19d, and 23a, 23b, 23c, and 23d respectively. However, it is understood that the first x-axis component 19 and the second x-axis component 23 each occupy only one of these positions at a given time. (The primary vertical positions of the first x-axis component 19 and of the second x-axis component 23 are shown sequentially in FIGS. 4A–4F and FIGS. 5A–5C.) As shown, the first load port 27 and a second load port 59 are advantageously positioned directly adjacent the first load lock 35 and the second load lock 49 of the fabrication tool 33, resulting in the overall footprint of the local area semiconductor wafer fabrication system being considerably smaller than that of prior art systems which require sufficient space for a front loader robot. Such advantageous positioning of the first load port 27 and the second load port 59 is possible because wafer carriers entering the load buffer 11 via the first load port 27 or the second load port 59 are extracted from the top of the first load port 27 and the second load port 59, respectively, rather than from the sides thereof. A number of other positions can also be employed, particularly for side opening load locks. Similarly, in this example, because the first load port 27 and the second load port 59 are loaded and unloaded from above, they may be positioned in close proximity to each other, unlike side loaded prior art systems whose load ports must be positioned a sufficient distance from each other to accommodate the loader robot's axis of rotation.

Further, as shown by FIG. 3, storage locations 25a and 25c preferably are positioned above the first load lock 35 and the second load lock 49, respectively, and the first wafer exchange port 31 and a second wafer exchange port 61 preferably are positioned above the transfer chamber 32 of the fabrication tool 33. The preferred location of the plurality of storage locations 25a–25d, the first wafer exchange port 31 and the second wafer exchange port 61 above the fabrication tool allows the footprint of the inventive local area semiconductor wafer fabrication system to be significantly smaller than that of prior art systems. The smaller footprint provided by the present invention reduces the system's cost of ownership which in turn reduces the cost of each unit produced.

FIGS. 4A–4F are side elevational views of the load buffer 11, which are useful in explaining a first aspect of wafer carrier transport through the load buffer 11. The components of the load buffer 11 are described above with reference to FIG. 1 and are therefore not repeated here. Further, in the preferred embodiment, the entire load buffer apparatus 11 is maintained under a vacuum hood. However, it is understood that if the load buffer 11 were not under vacuum, the steps of opening a pod type wafer carrier and loading the wafers to the load lock would be performed within an enclosed vacuum chamber that would surround each wafer exchange port and the open load lock associated therewith.

Figure 4A:
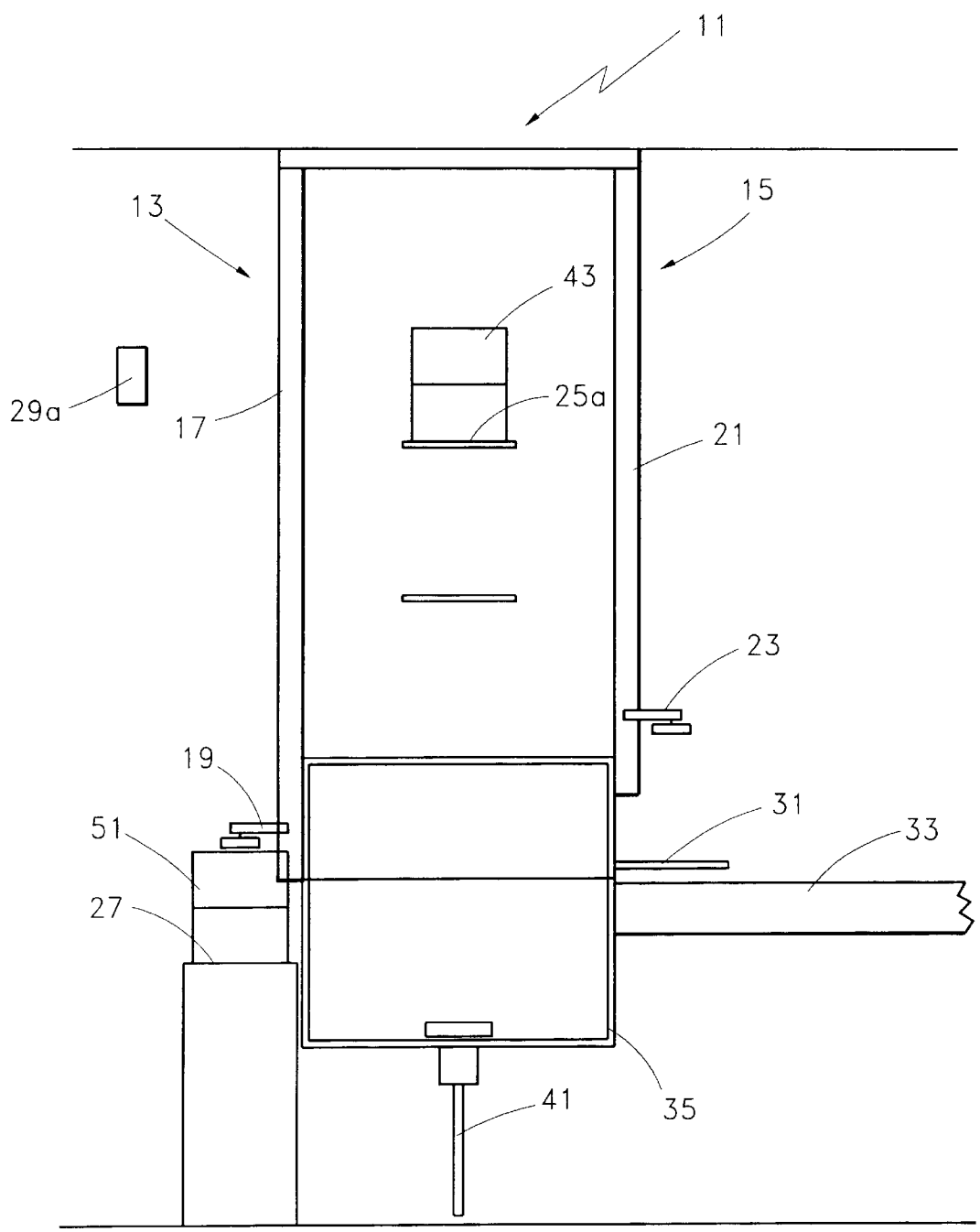
FIGS. 4A–4F are side elevational views of the load buffer of FIG. 1, which are useful in explaining a first aspect of wafer carrier transport therethrough.

As shown in FIG. 4A the first wafer carrier 43 is in storage at the storage location 25a. In operation, a second wafer carrier 51 is placed on the first load port 27 by, for example, an operator, automatic guided vehicle (AGV) or rail-guided vehicle (RGV), and the first x-axis component 19 of the first robot 13 lowers to pick up the second wafer carrier 51, as shown in FIG. 4A. The second robot 15 operates independently of the first robot 13, and may therefore be in any required position at a given time.

Figure 4B:
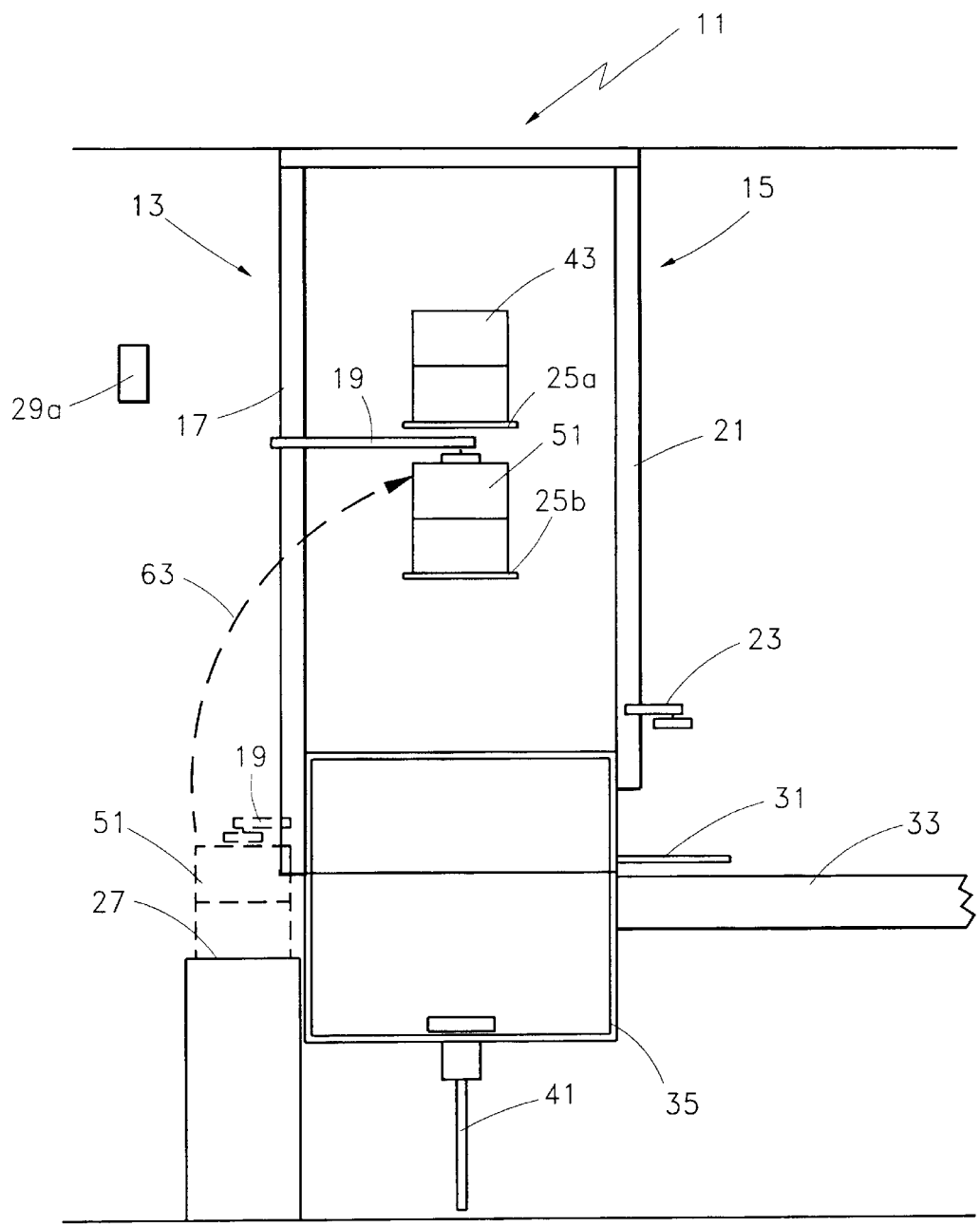

Next, as shown in FIG. 4B, the first x-axis component 19 lifts the second wafer carrier 51 and pivots to deposit the second wafer carrier 51 on the storage location 25b, as represented by arrow 63.

Figure 4C:
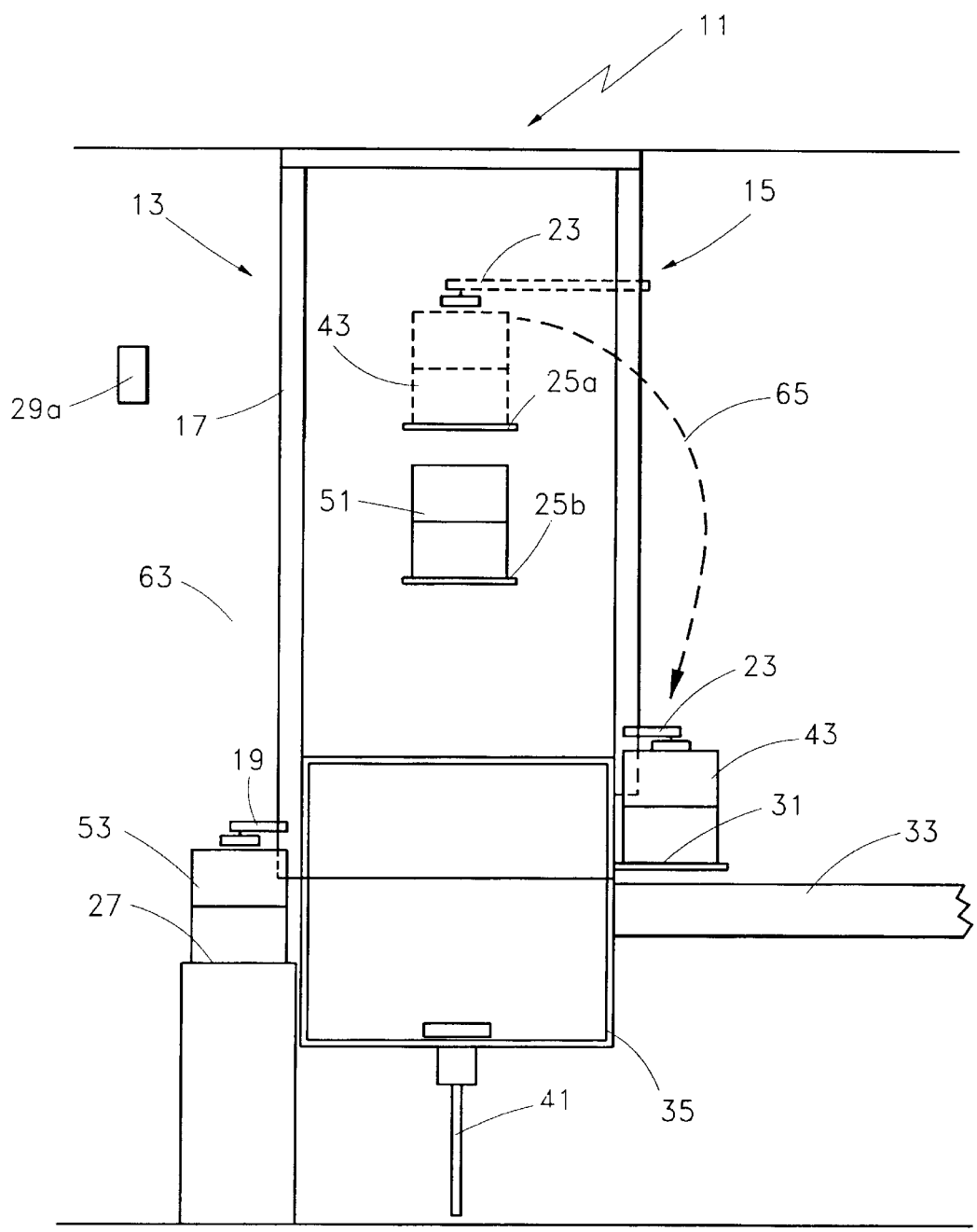

Thereafter, as shown in the example of FIG. 4C, the first x-axis component 19 may pivot and lower to pick up the third wafer carrier 53 from the first load port 27, as the second x-axis component 23 of the second robot 15 picks up the first wafer carrier 43 from the storage location 25a, pivots, lowers and deposits the first wafer carrier 43 at the first wafer exchange port 31, as represented by the arrow 65.

Figure 4D:
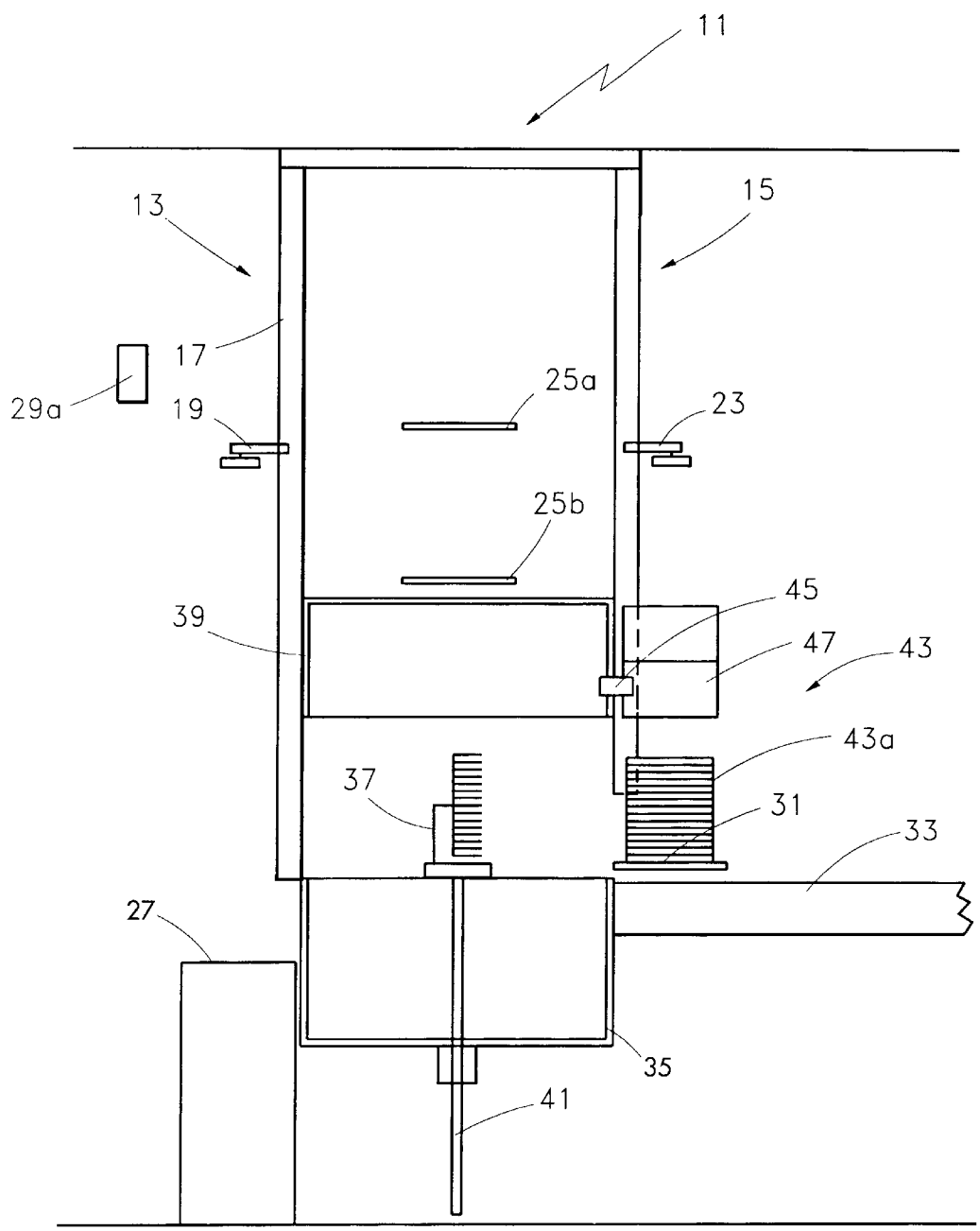

As shown in FIG. 4D the first lid 39 of the first load lock 35 elevates, and the wafer carrier-engaging mechanism 45, which engages the second lid 47, of the first wafer carrier 43, causes the second lid 47 to elevate. Thus, the first wafer carrier 43 is open and any number of wafers or the entire cassette 43a (i.e., the contents of the open pod type first wafer carrier 43) may be transferred from the first wafer exchange port 31 to the open first load lock 35. As described with reference to FIG. 1, the first loader mechanism 37 may be a conventional apparatus, or, preferably, is as described in application Ser. No. 08/763,604. The apparatus described in Ser. No. 08/763,604 comprises a slotted assembly which extends to position the slots beneath the wafers to be extracted. The assembly then elevates, lifting the wafers, and retracts. The assembly can be modified such that the number of slots correspond to the number of wafers to be extracted, or can be modified to extend to a position beneath the entire cassette, thus transporting the entire cassette when the assembly retracts.

Figure 4E:
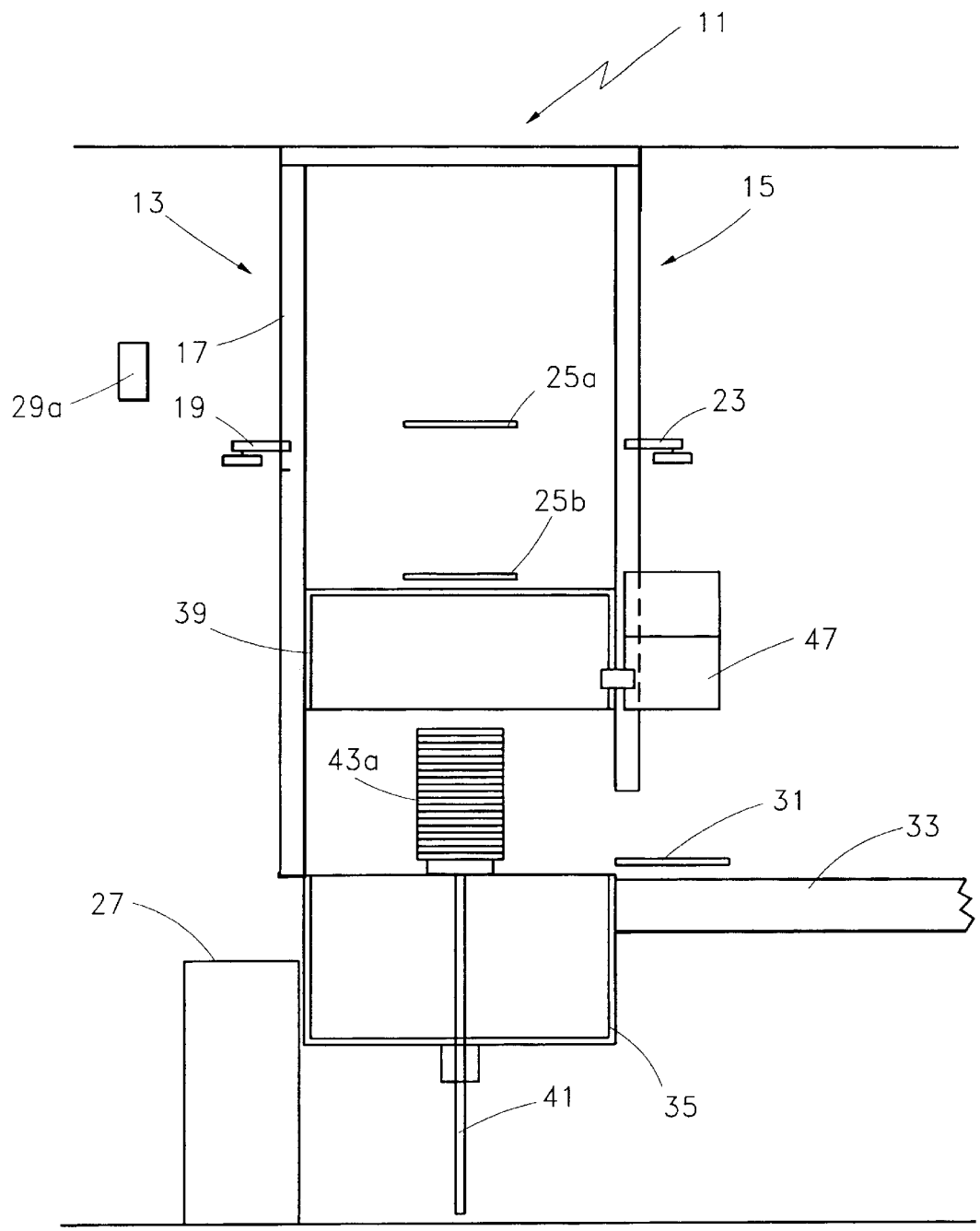

FIG. 4E shows the wafer cassette 43a (extracted from the open first wafer carrier 43) positioned on the lift-lower mechanism 41 for subsequent lowering into the first load lock 35.

Figure 4F:
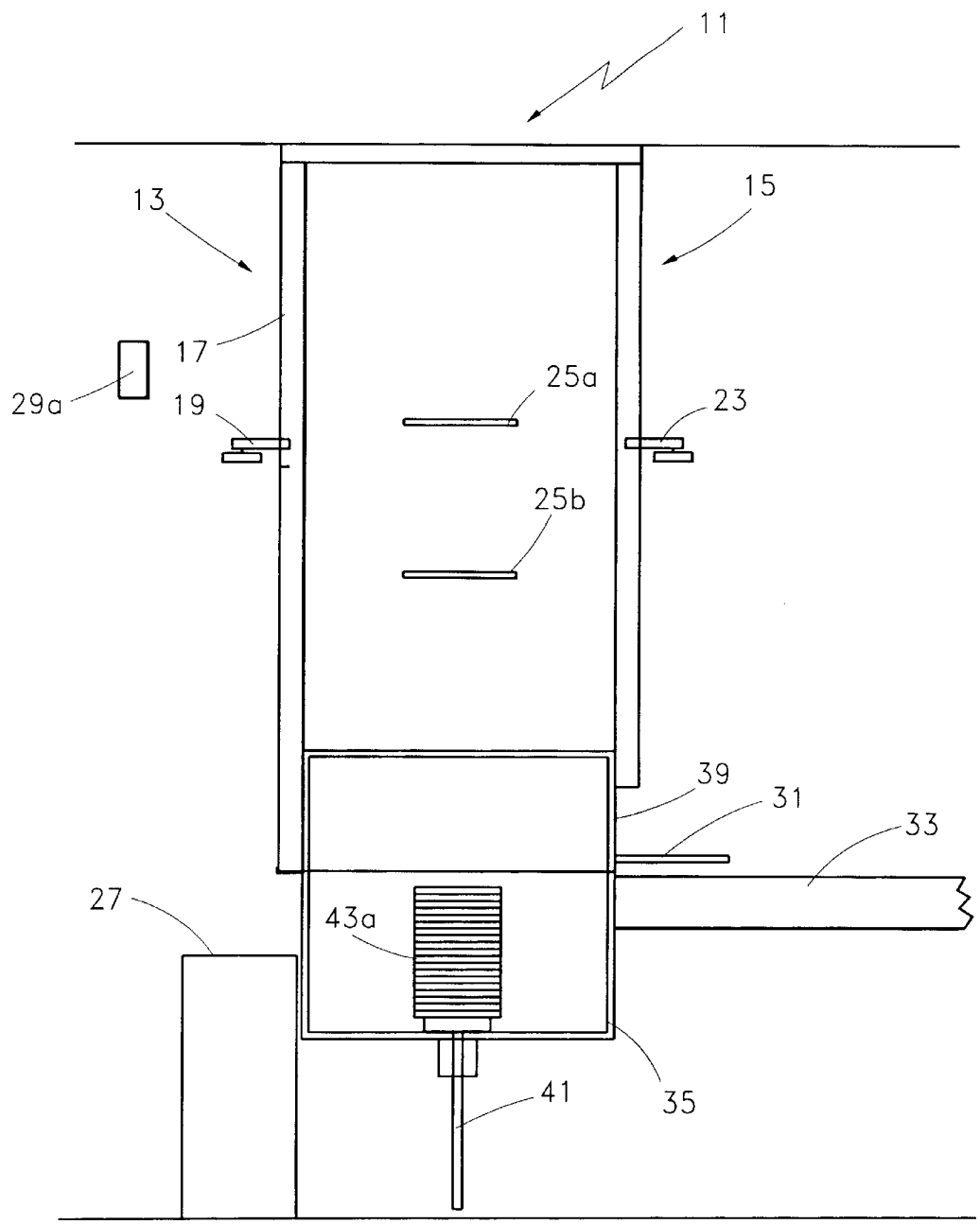

FIG. 4F shows the wafer cassette 43a positioned within the first load lock 35, and the first lid 39 of the first load lock 35 in the closed position. Thereafter wafers may be extracted from the first load lock 35 and processed within the fabrication tool 33. The empty first wafer carrier 43 can be closed and moved to one of the storage locations 25a–25d or can remain positioned on first wafer exchange port 31 until wafers have been processed and returned to the first wafer carrier 43.

The first robot 13 and the second robot 15 may continue to operate independently of the loading of the first wafer carrier 43 from the first wafer exchange port 31 to the first load lock 35. Although not shown in FIGS. 4E and 4F, the first robot 13 may continue transferring wafer carriers between the first load port 27 and/or the overhead load port (e.g., a predetermined location along the monorail 29) and the plurality of storage locations 25a–25d; and the second robot 15 is able to pick up wafer carriers as required from the plurality of storage locations 25a–25d, and deposit them at either the first wafer exchange port 31 or the second wafer exchange port 61, provided the particular wafer exchange port is vacant.

The configuration of the load buffer 11 advantageously enables independent operation of the first robot 13 and the second robot 15, and enables independent loading and unloading of each pair of load ports (e.g., the first load port and the first wafer exchange port) and the overhead load ports. Thus, it is understood that the specific operation of the load buffer 11 described with reference to FIGS. 4A–4F is merely exemplary.

Figure 5A:
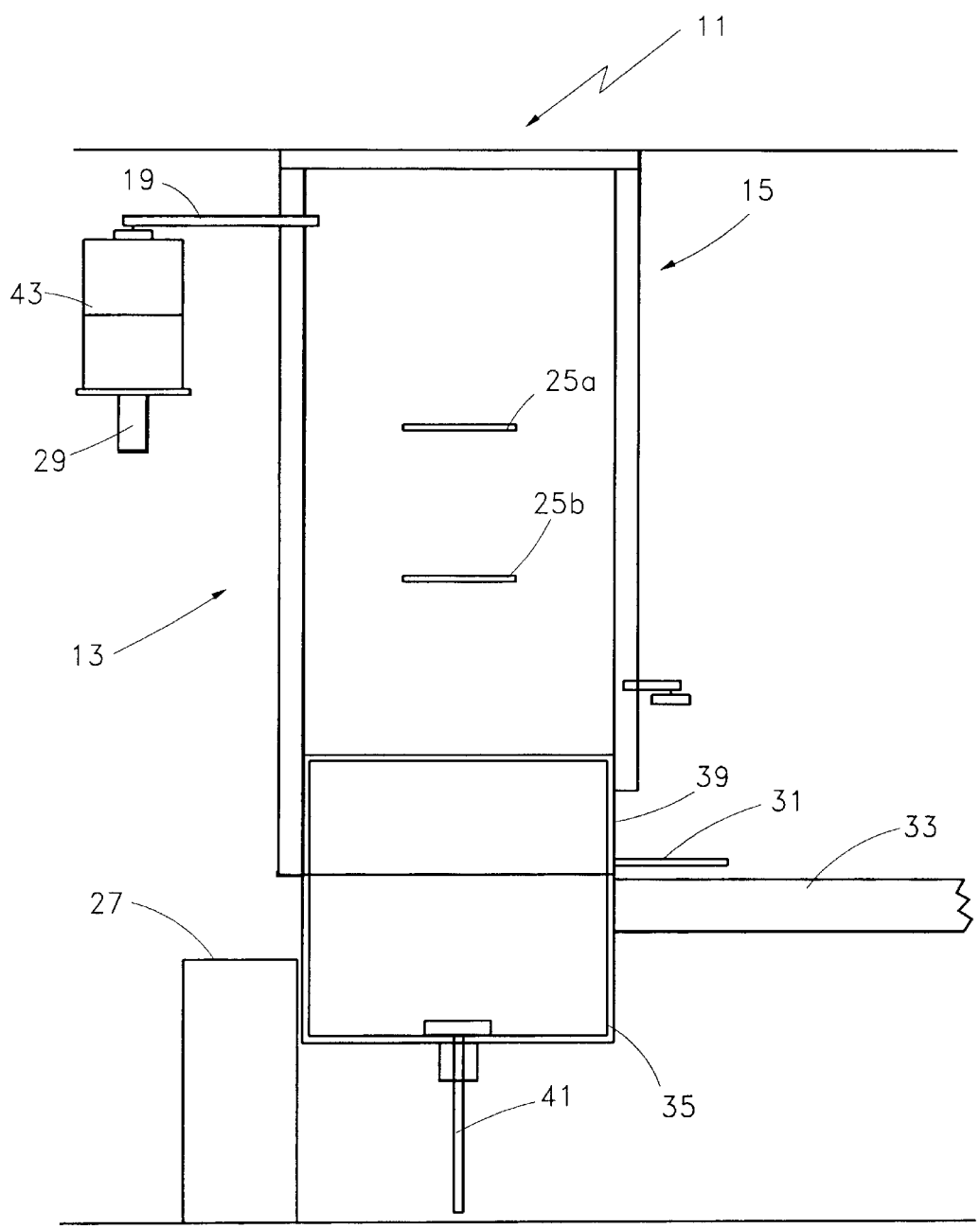
FIGS. 5A–5C are side elevational views of the load buffer of FIG. 1, which are useful in explaining a second aspect of wafer carrier transport therethrough.
Figure 5B:
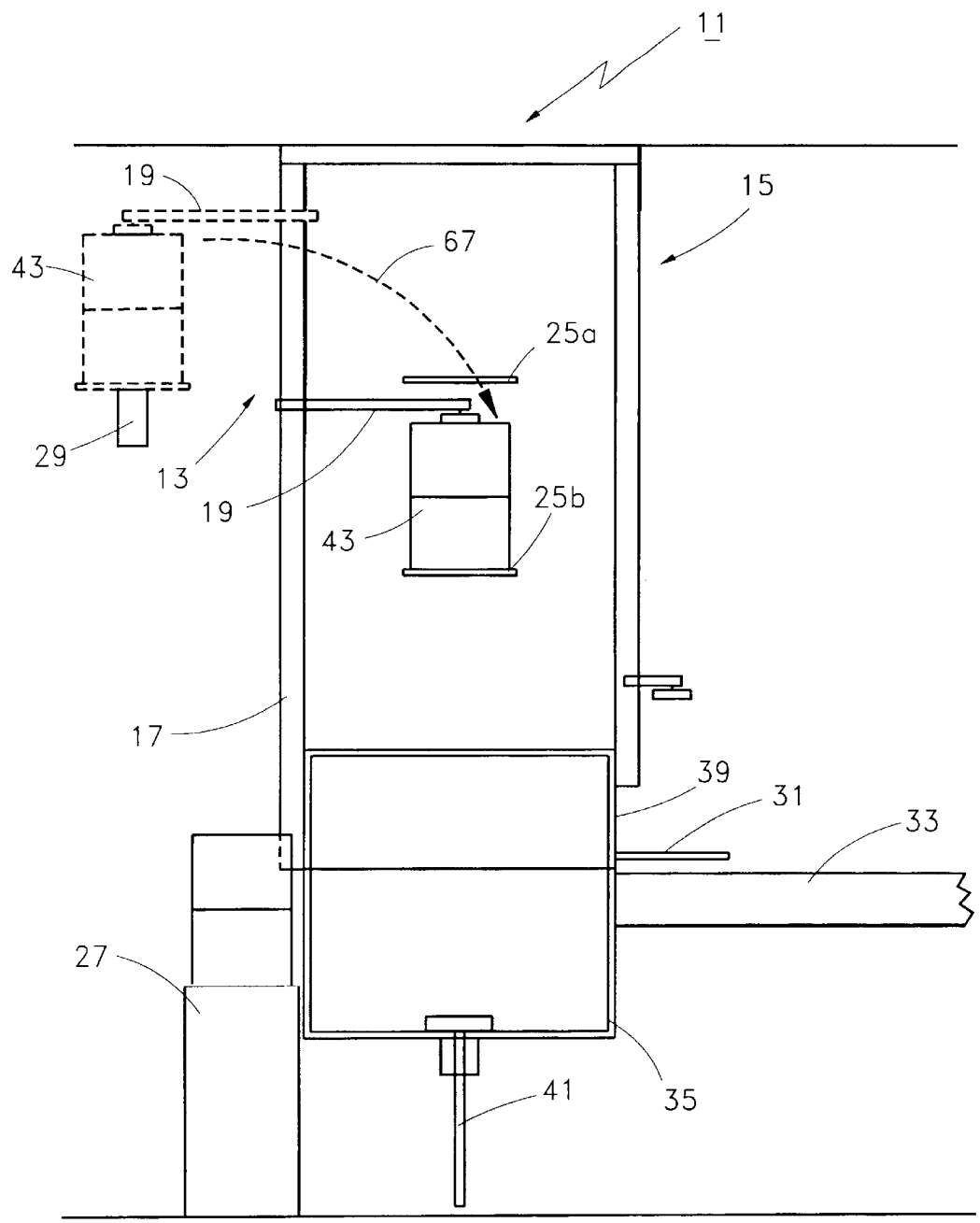
Figure 5C:
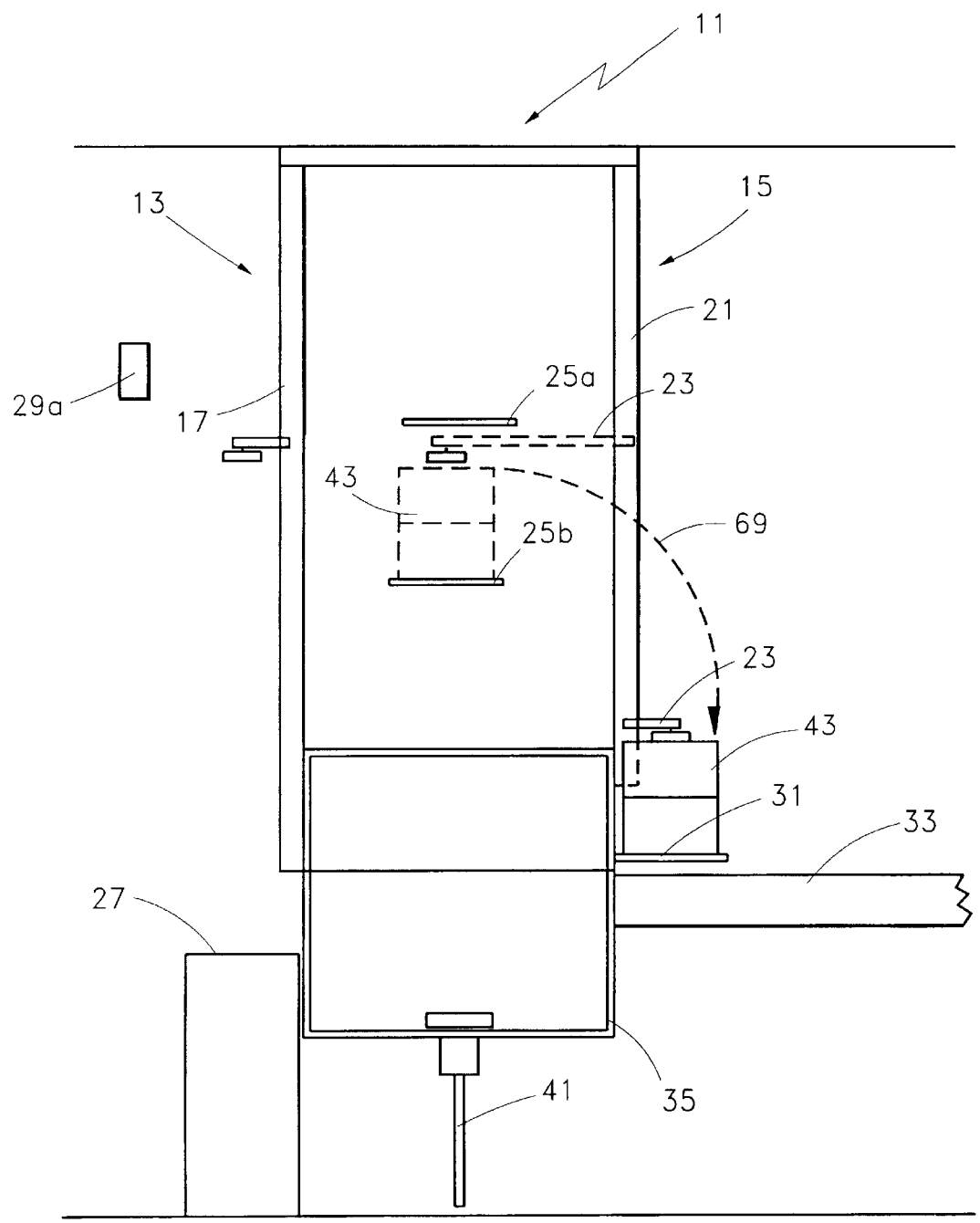

FIGS. 5A–5C are side elevational views of the load buffer of FIG. 2, which are useful in explaining a second aspect of wafer carrier transport therethrough. As shown in FIG. 5A the first x-axis component 19 of the first robot 13 pivots to pickup the first wafer carrier 43 from the monorail 29. Thereafter as shown in FIG. 5B, the first x-axis component 19 lowers and pivots about the first y-axis component 17 to deposit the first wafer carrier 43 on the storage location 25b, as represented by the arrow 67. Then, as shown in FIG. 5C, the second x-axis component 23 of the second robot 15 picks up the first wafer carrier 43 from the storage location 25b and pivots about the second y-axis component 21 and lowers to deposit the first wafer carrier 43 on the first wafer exchange port 31, as represented by arrow 69. Thereafter the first wafer carrier 43 is opened and lowered into the first load lock 35 as previously described with reference to FIGS. 4D–4F. While only the first wafer carrier 43 is shown traveling through the load buffer 11, it is understood that when the first x-axis component 19 and the second x-axis component 23 are not transporting the first wafer carrier 43, they may be picking up, transporting, or depositing other wafer carriers at any location within load buffer 11, as previously described. In sum, the operation of the first robot 13 and the second robot 15 may be synchronous at certain times, and also may operate asynchronously at other times. Therefore it is understood that the specific operation of the load buffer 11 described with reference to FIGS. 5A–5C is merely exemplary.

After processing is complete and the wafers have been returned to the load lock 35, the lid of load lock 35 elevates, the lift/lower mechanism 41 lifts the wafers to the elevation of the first wafer exchange port 31, and the first loader mechanism 37 returns the wafers to the cassette 43 positioned on the wafer exchange port 31. As the first lid 39 of load lock 35 lowers, lift/lower mechanism 41 lowers, and the second lid 47 of the wafer carrier 43 lowers, sealing around the cassette 43a. Thereafter the second robot 15 transfers the wafer carrier 43 either to a storage shelf 25 or to the second overhead load port. If the second robot 15 places the wafer carrier 43 on one of the storage shelves 25, the first robot 13 may then transfer the wafer carrier 43 either to the first load port 27 or to the first overhead load port. Thus a wafer carrier full of processed wafers travels backward through the load buffer 11 in the same manner as a wafer carrier of unprocessed wafers travels forward through the load buffer 11, only the direction of travel changes. Each robot elevates a wafer carrier between the respective load port or wafer exchange port and the overhead load ports or storage shelves. As used herein the term "elevate" refers to any y-axis movement and therefore includes both lifting and lowering.

In operation, at any given time wafer carriers may be traveling both forward and backward through the load buffer 11. Thus, a robot may transfer a first wafer carrier to the storage shelves or to the overhead load ports, and then immediately pick up a second wafer carrier for transfer to one of the load ports or to the wafer exchange ports.

Although with reference to the side elevational views of FIGS. 1, 4A–F and 5A–C only the first side of the load buffer 11 is shown and described (i.e., the first load port through the first wafer exchange port) it is understood that the configuration and operation of the second side of the load buffer 11 (i.e., the second load port through the second wafer exchange port) is identical to that disclosed. Further, although only a single shelf-type load buffer is disclosed, it will be understood by those of ordinary skill in the art, that the first robot 13 and/or the second robot 15 can be adapted to reach one or more shelves of an adjacent load buffer, and, central shelves may even be positioned between two adjacent load buffers so as to provide a position at which wafer carriers may be passed from one load buffer to the next.

Figure 6A:
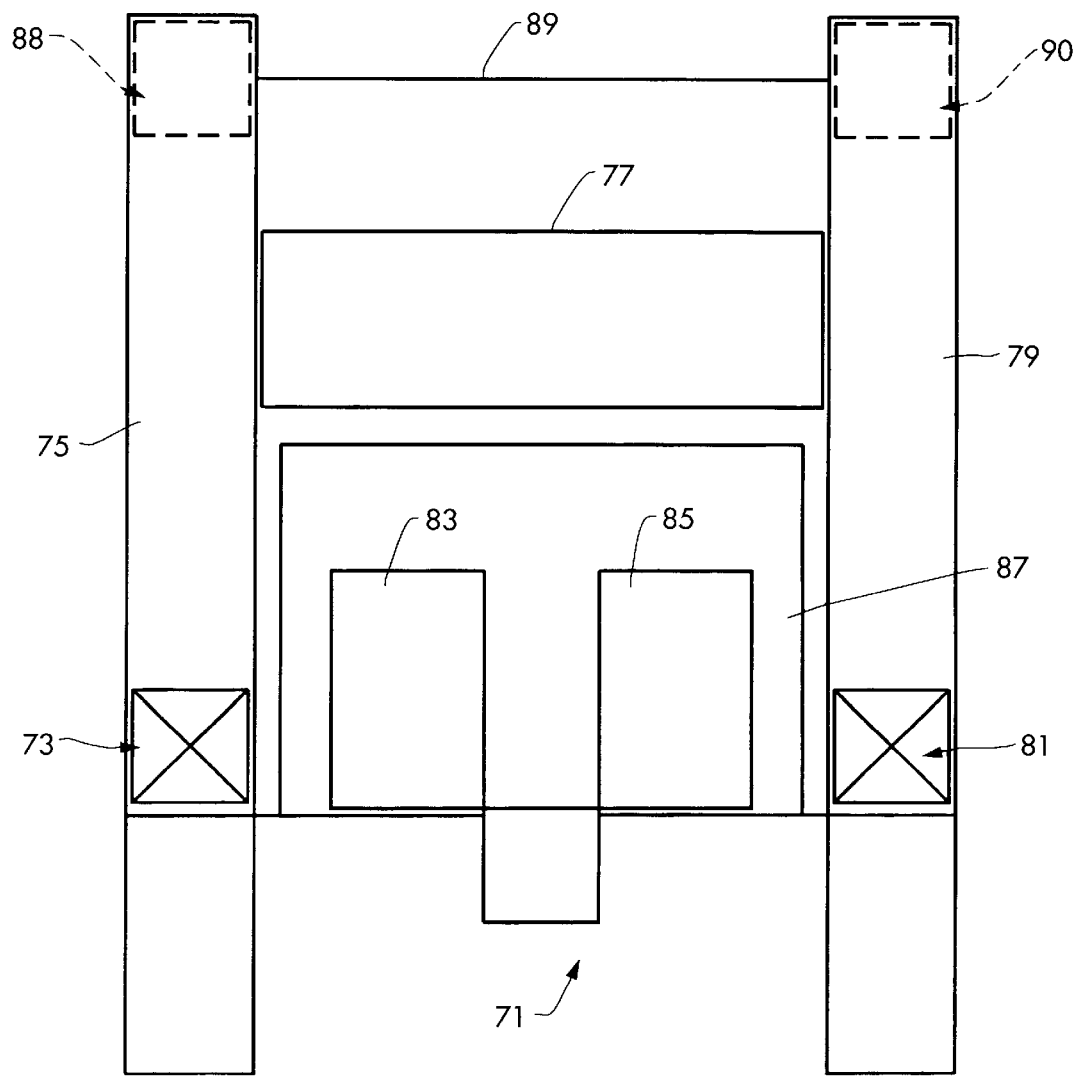
FIG. 6A is a side elevation view of an aspect of a conveyor-type inventive load buffer wherein the load ports are contiguous with the vertical transfer mechanisms.

FIG. 6A is a side elevation view of a conveyor-type load buffer 71, wherein the load ports are contiguous with the vertical transfer mechanisms. As shown in FIG. 6A, the load buffer 71 comprises a first load port 73. In the configuration shown, the first load port 73 is a port for loading wafer carriers from the factory. The first load port 73 is operatively coupled to a first elevator 75 which receives wafer carriers from the factory through the first load port 73. The upper portion of the first elevator 75 is operatively coupled to one end of a horizontal transfer mechanism 77, and the other end of the horizontal transfer mechanism 77 is operatively coupled to the upper portion of a second elevator 79. A lower portion of the second elevator 79 operatively couples a second load port 81. In the configuration shown, the second load port 81 is a port for loading wafer carriers from the load buffer 71 into either a first load lock 83 or a second load lock 85 of a fabrication tool 87. In the most preferred embodiment, the first load port 73 is a predetermined location which the first elevator 75 occupies when it is in its lowest position, and the second load port 81 is a predetermined location which the second elevator 79 occupies when it is in its lowest position.

Figure 6B:
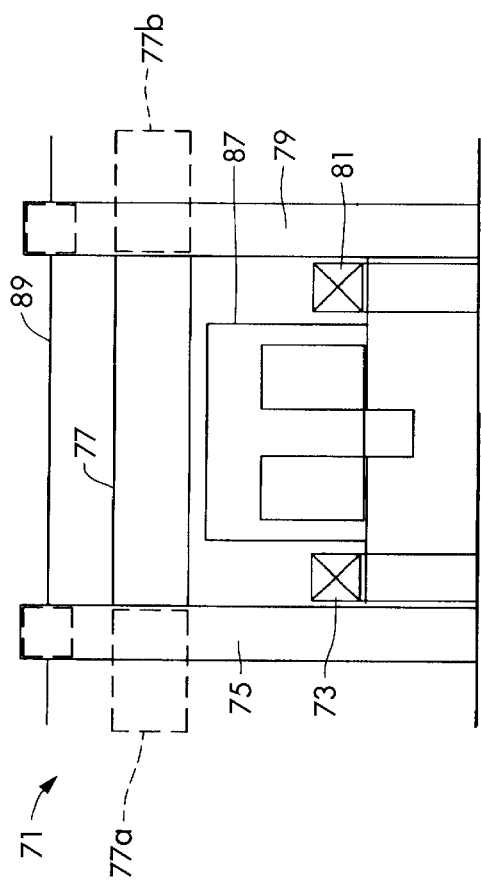
FIG. 6B is a side elevation view of an aspect of a conveyor-type load buffer wherein the load ports are adjacent the vertical transfer mechanisms.

The inventive load buffer 71 shown in FIG. 6B is configured such that the first elevator 75 and the second elevator 79 extend to a height greater than that of the fabrication tool 87 and such that the horizontal transfer mechanism 77 is located above (i.e., at least partially overlapping) the footprint of the fabrication tool 87. Preferably the horizontal transfer mechanism 77 is substantially above, and most preferably completely above the footprint of the fabrication tool 87. It will be apparent to those of ordinary skill in the art that the load buffer 71 may be positioned in front of the tool, beside the tool, etc., and that a position above the fabrication tool is merely preferred. Thus, the load buffer 71 of the present invention provides wafer storage and movement within a minimized footprint. Further, the first elevator 75 and/or the second elevator 79 may be operatively coupled to a wafer carrier transport system. The first elevator 75 and the second elevator 79 of FIG. 6A are shown operatively coupled to an overhead wafer carrier transport system 89 via a first overhead load port 88 and a second overhead load port 90, respectively. In the most preferred embodiment, the first overhead load port 88 is a predetermined location which the first elevator 75 occupies when it is in its highest position, and the second overhead load port 90 is a predetermined location which the second elevator 79 occupies when it is in its highest position. As shown in FIG. 6B, the horizontal transfer mechanism may have an extended portion 77a, 77b which respectively extends beyond the first vertical transfer mechanism 75 and/or the second vertical transfer mechanism 81. The extended portions 77a, 77b provide additional storage locations, and can be coupled to the horizontal transfer mechanism 77 (or to the extended portions 77a, 77b) of another fabrication tool to provide a local interconnection of fabrication tools (see FIG. 6C).

In operation an automated local area fabrication system; comprising the load buffer 71, at least the first load lock 83, and at least one processing chamber; receives a wafer carrier in the first load port 73. Typically the wafer carrier will be traveling from a previous processing location (e.g., an additional automated local area fabrication system) and may be transported to and loaded into the first load port 73 via a factory automation system, an automatic guided vehicle, or an operator, etc. The wafer carrier is loaded via the first load port 73 into the first elevator 75. The first elevator 75 elevates the wafer carrier to the upper portion of the first elevator 75 which is connected to the horizontal transfer mechanism 77. Thereafter the wafer carrier is transferred to the horizontal transfer mechanism 77 via conventional methods, for example, the first elevator 75 may comprise an x-y robot that delivers a wafer carrier to the horizontal transfer mechanism 77 and then returns to the first load port 73, or, the first elevator 75 may comprise a surface of rolling elements which are actuated when the surface is aligned with the horizontal transfer mechanism 77, causing the wafer carrier to be transferred across the rolling elements to the horizontal transfer mechanism 77.

After traveling though the horizontal transfer mechanism 77 the wafer carrier is transferred from the horizontal transfer mechanism 77 to the upper portion of the second elevator 79 via conventional methods. The second elevator 79 then lowers the wafer carrier to the second load port 81 where a conventional loader mechanism 91 (e.g., a robot) transfers one or more wafers, or the entire wafer carrier from the second load port 81 to either the first load lock 83 or the second load lock 85 of the fabrication tool 87. Within the fabrication tool 87 wafers are transferred from the first load lock 83 or the second load lock 85 to one or more process chambers 86 (see FIG. 10) for processing. Alternatively, the first elevator 75 and/or the second elevator 79 may transfer a wafer carrier to the overhead factory transfer system 89 via the first overhead load port 88 or the second overhead load port 90.

FIG. 6B is a side elevation view of a preferred embodiment of an inventive load buffer wherein the first load port 73 is adjacent the first vertical transfer mechanism 75, and the second load port 81 is adjacent the second vertical transfer mechanism 79. Each load port is coupled to the respective vertical transfer mechanism via conventional methods (e.g., a pick and place robot, a plurality of rolling elements, etc.) which transfer a wafer carrier between the respective load port and the vertical transfer mechanism. This type of adjacent configuration could be used to retrofit existing fabrication tools with the load buffer of the present invention. Except for the positioning of the load ports and the vertical transfer mechanisms, the load buffer of FIG. 6B is configured and operates the same as that of FIG. 6A.

Figure 6C:
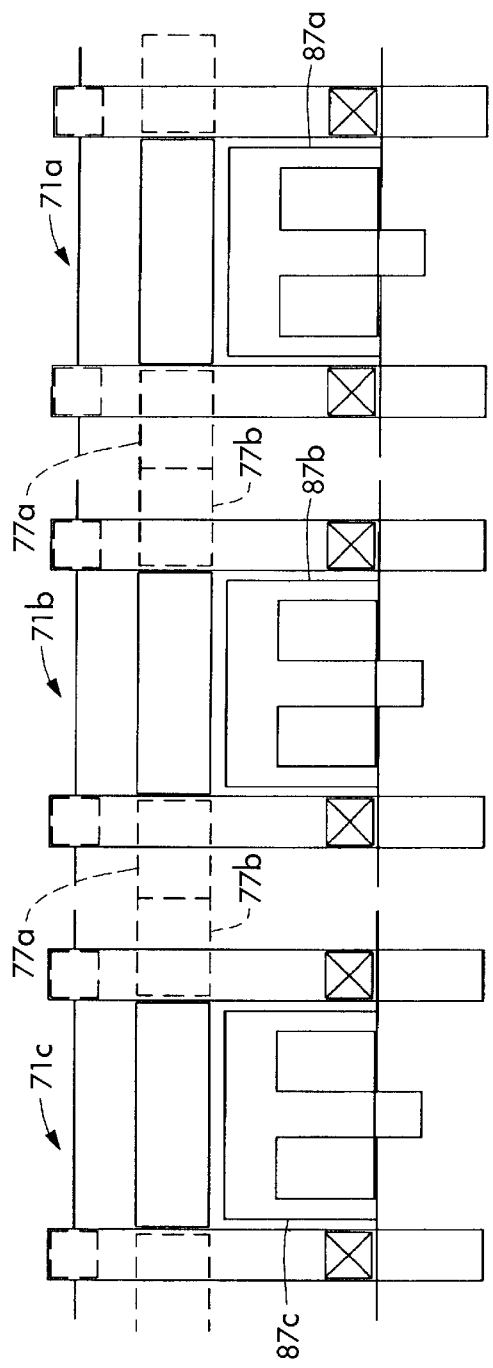
FIG. 6C is a side elevational view of a local interconnection of fabrication tools, which employs the second embodiment of the invention.

FIG. 6C is a side elevational view of a local interconnection of fabrication tools. As shown in FIG. 6C, a plurality of fabrication tools 87a, 87b, 87c are interconnected via the extended horizontal transfer mechanisms 77a, 77b, of load buffers 71a, 71b and 71c. Specifically, the extended portion 77a of the load buffer 71a is coupled to the extended portion 77b of the load buffer 71b, and the extended portion 77a of the load buffer 71b is coupled to the extended portion 77b of the load buffer 71c. In this configuration, a wafer carrier may advantageously travel directly between the interconnected load buffers, without the aid of the overhead wafer carrier transport system, an AGV or operator. Such local interconnection of fabrication tools increases the flexibility and the transaction capability of the factory material handling system.

Figure 7A:
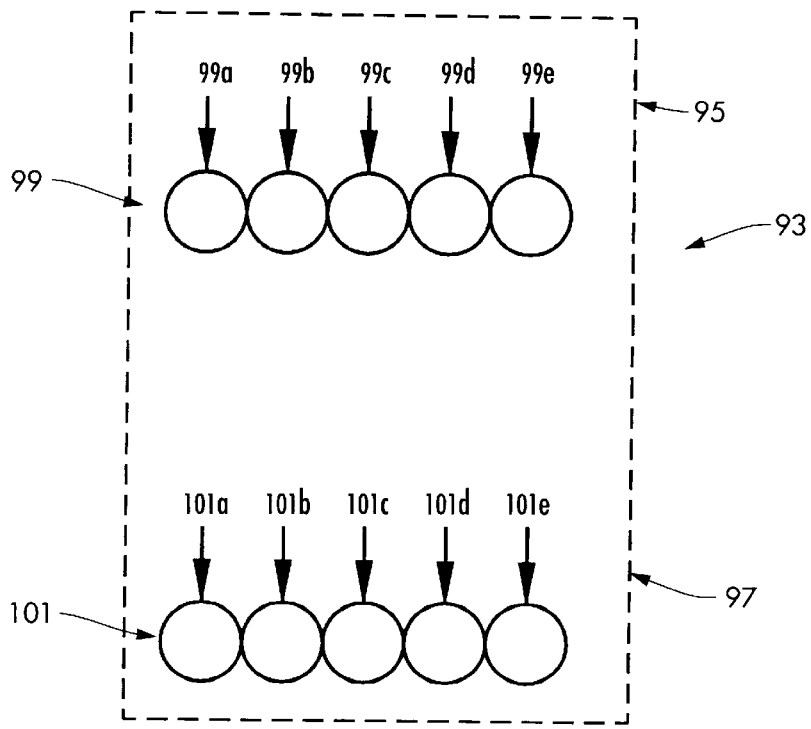
FIG. 7A is a side elevational view of a vertically oriented dual-compartment segment of a preferred modular conveyor employed in a conveyor-type load buffer.
Figure 7B:
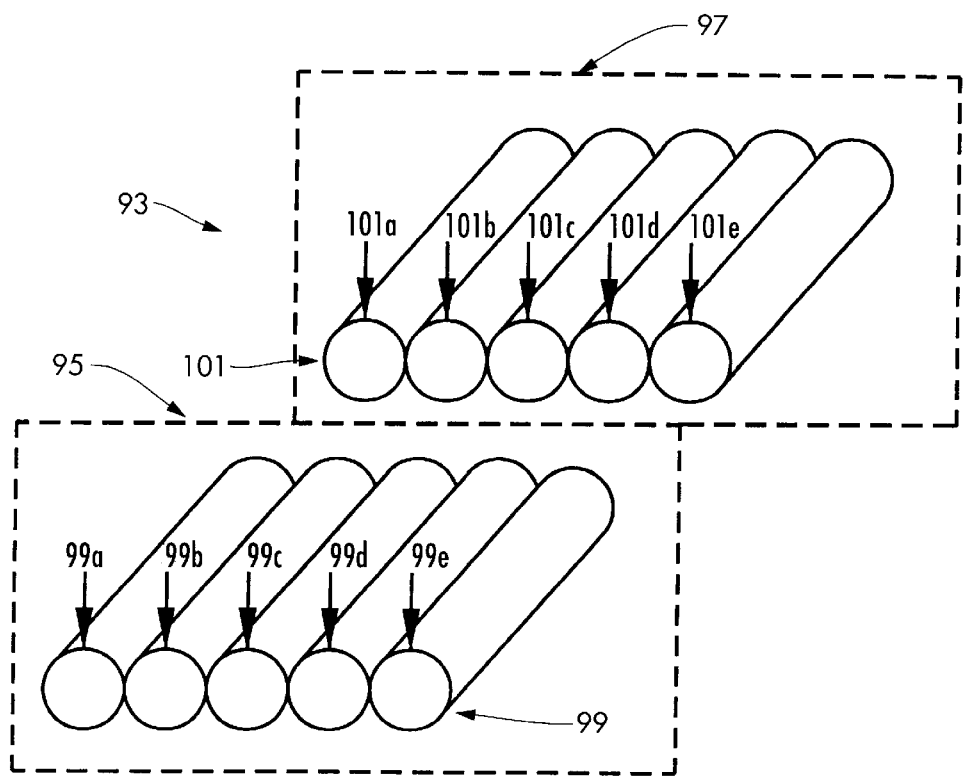
FIG. 7B is a side perspective view of a horizontally oriented dual-compartment segment of a preferred modular conveyor employed in a conveyor-type load buffer.

FIGS. 7A and 7B depict individual segments of a preferred horizontal transfer mechanism. FIG. 7A is a side view of a dual-compartment segment 93 of a preferred modular conveyor employed in a first aspect of the conveyor-type inventive load buffer. The conveyor segment 93 comprises a first compartment 95 and a second compartment 97, respectively having a first surface 99 comprised of a plurality of rolling elements 99a–e and a second surface 101 comprised of a plurality of rolling elements 101a–e. In a preferred embodiment a plurality of the conveyor segments 93 of FIG. 7A are operatively coupled to form a modular bi-level conveyor 103 (see FIGS. 8 and 9). Any number of dual-compartment segments 93 may be coupled together so as to form a bi-level conveyor 103 of a desired length. The bi-level structure guarantees an open movement channel, and can be constructed by joining levels of conventional rolling element type conveyors such as those manufactured by Middlesex General Industries, Inc. of Woburn, Mass. and described in U.S. Pat. No. 4,793,262, entitled "Transport System For Computer Integrated Manufacturing/Storage And Drive Component Therefore," the entirety of which is incorporated herein by this reference.

FIG. 7B is a side perspective view of an alternative horizontally oriented dual-compartment segment 93 of a preferred modular conveyor employed in a second aspect of the inventive conveyor-type load buffer. Like the conveyor segment 93 of FIG. 7A, the conveyor segment 93 of FIG. 7B comprises the first compartment 95 and the second compartment 97 respectively having the first surface 99 comprised of the plurality of rolling elements 99a–e and the second surface 101 comprised of the plurality of rolling elements 101a–e. In a preferred embodiment a plurality of the conveyor segments 93 of FIG. 7B are operatively coupled to form a modular conveyor 103 (see FIGS. 8 and 10). Any number of dual-compartment segments 93 may be coupled together so as to form a conveyor 103 of a desired length.

Figure 8:
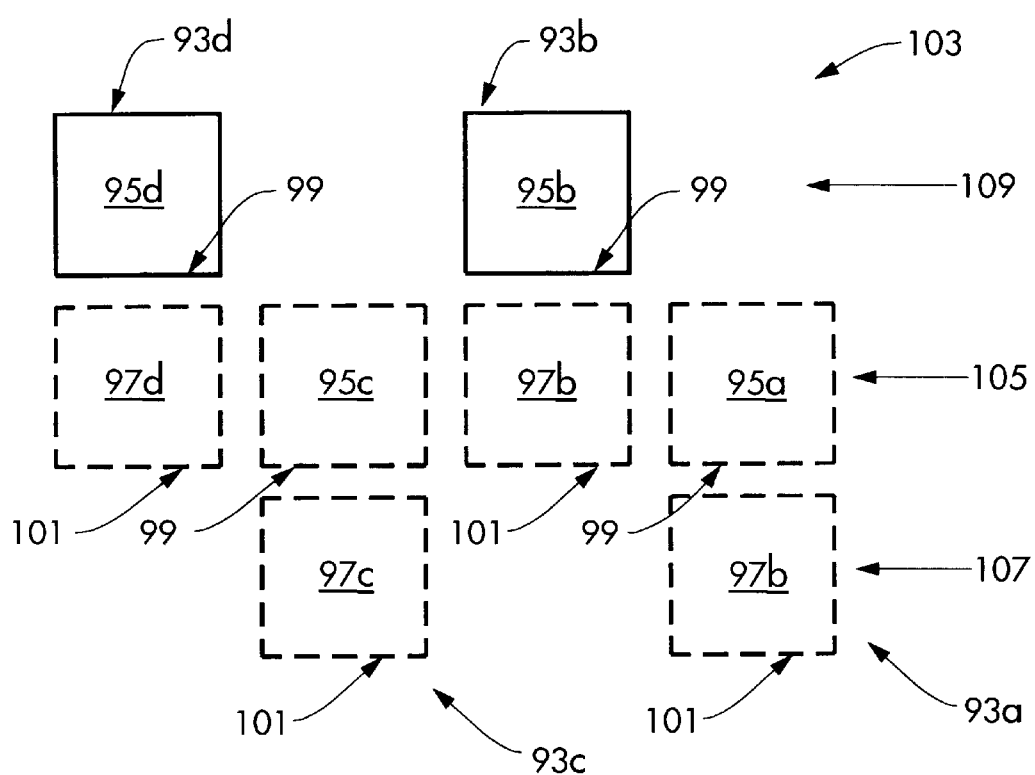
FIG. 8 is a side elevational view of a bi-level conveyor comprised of a plurality of the dual-compartment segments of FIG. 7A.

FIG. 8 is a side elevational view of a bi-level conveyor 103 comprised of a plurality of the dual-compartment segments 93 of FIG. 7A, wherein the dual-compartment segments 93a–d are vertically oriented and coupled together to provide a storage and movement channel. FIG. 8 is useful for describing two positions (a neutral position and a positive position) each dual-compartment segment 93 may assume. In FIG. 8, dual-compartment segment 93a and dual-compartment segment 93c are shown in the neutral position, and dual-compartment segment 93b and dual-compartment segment 93d are shown in the positive position. Three channels are defined by the two possible positions of the dual-compartment segments 93a–d; a move channel 105, a shuttle channel 107 and a storage channel 109. In the neutral position the first compartment 95 of the dual-compartment segment 93 occupies the move channel 105, and the second compartment 97 of the dual-compartment segment 93 occupies the shuttle channel 107.

In the positive position the first compartment 95 of the dual-compartment segment 93 occupies the storage channel 109 and the second compartment 97 of the dual-compartment segment 93 occupies the move channel 105. Thus, although a given dual-compartment segment 93 may be positioned such that a compartment occupies either the shuttle channel 107 or the storage channel 109, each dual-compartment segment 93 has a compartment which occupies the move channel 105. Therefore the move channel 105 is a continuous channel, formed of the first compartment 95 and/or the second compartment 97 of a plurality of the dual-compartment segments 93, through which wafer carriers may travel; and the shuttle channel 107 and the storage channel 109 are intermittently occupied by the second compartment 97 or the first compartment 95, respectively, of one or more dual-compartment segments 93. Thus, the shuttle channel 107 and/or the storage channel 109 may store wafer carriers without blocking the passage of wafer carriers through the move channel 105.

In the preferred operation, initially each dual-compartment segment 93a–d is neutrally positioned. A first wafer carrier (not shown) is then loaded into the first compartment 95 of dual-compartment segment 93a and can: 1) travel immediately along the move channel 105 to the end of the bi-level conveyor 103 where the first wafer carrier will be unloaded from the bi-level conveyor 103; 2) travel a distance along the bi-level conveyor 103 (e.g., to dual-compartment segment 93b, 93c or 93d) and then be placed in storage (e.g., placed in the storage channel 109 by shifting the respective dual-compartment segment 93 to a positive position); or 3) immediately be placed in storage (e.g., by shifting dual-compartment segment 93a to a positive position).

To remove a wafer carrier from storage and return the wafer carrier to the move channel 105, the dual-compartment segment 93 containing the wafer carrier is shifted from the positive position to the neutral position. Thereafter, the wafer carrier may continue traveling along the move channel 105. Thus, by employing a bi-level conveyor 103 and by designating one channel for storage and one channel for movement, a first wafer carrier may be placed in storage at any point along the bi-level conveyor 103 (i.e., within any of the plurality of dual-compartment segments 93a–d) without obstructing the passage of a second wafer carrier through the move channel 105. Although the move channel 105 is preferably used only for moving wafer carriers, and the storage channel 109 is preferably used only for storing wafer carriers, the storage channel 109 and/or the move channel 105 may perform a combination of storage and movement functions.

Figure 9:
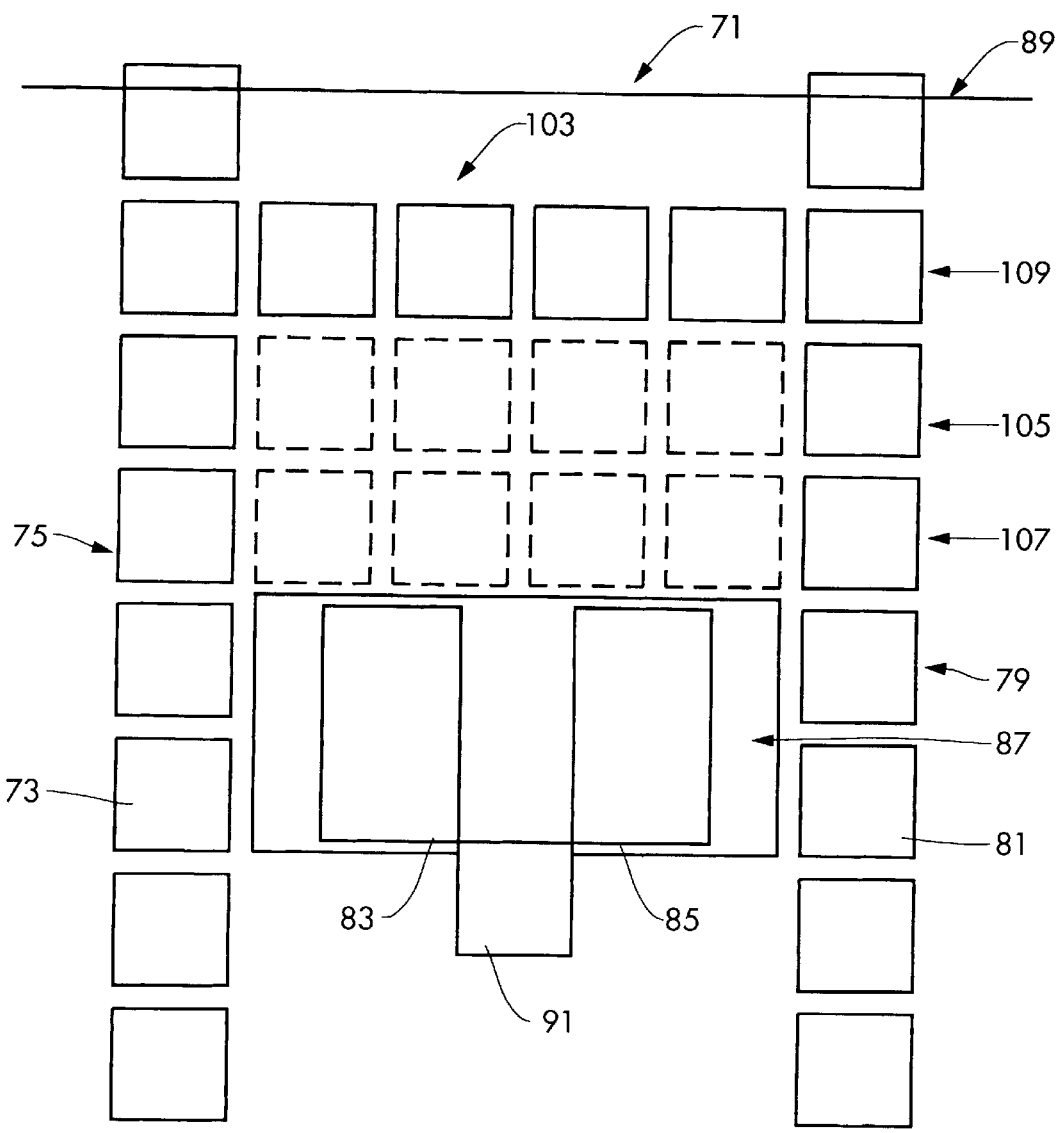
FIG. 9 is a side elevation view of a preferred embodiment of the inventive load buffer wherein the transfer mechanism comprises the bi-level conveyor of FIG. 8.

FIG. 9 is a side elevation view of a preferred embodiment of an inventive load buffer 71 wherein the horizontal transfer mechanism 77 comprises the bi-level conveyor 103 of FIG. 8. The overall configuration of the load buffer 71 and the bi-level conveyor 103 are described with reference to FIGS. 6 and 8, respectively, and are therefore not repeated here. The operation of the load buffer of FIG. 8 is described below.

In operation an automated local area fabrication system; comprising the load buffer 71, at least the first load lock 83, and at least one processing chamber; receives a wafer carrier in the first load port 73. Typically the wafer carrier will be traveling from a previous process location (e.g., an additional automated local area fabrication system) and may be transported to and loaded into the first load port 73 via, for example, a factory automation system, an automatic guided vehicle, or an operator. The wafer carrier is loaded via the first load port 73 into the first elevator 75. The first elevator 75 elevates the wafer carrier to the upper portion of the first elevator 75 which is connected to the bi-level conveyor 103. Thereafter the wafer carrier is transferred to the bi-level conveyor 103 via conventional methods. An actuator (not shown) controls the bi-level conveyor 103 causing a given dual-compartment segment 93 to shift from the neutral position to the positive position and vice versa. The actuator also controls the operation of the first plurality of rolling elements 99a–e, and the second plurality of rolling elements 101a–e, selectively causing them to rotate and thus to transfer a wafer carrier from one universe of rolling elements to the next. By selectively shifting the dual-compartment segments 93a–d and rotating the plurality of rolling elements 99a–e and 101a–e, wafer carriers are stored in the storage channel 109 and transferred through the move channel 105, as described previously in conjunction with FIG. 8.

After traveling though the bi-level conveyor 103 the wafer carrier is transferred from the bi-level conveyor 103 to the upper portion of the second elevator 79 via conventional methods. The second elevator 79 then lowers the wafer carrier to the second load port 81 where a conventional loader mechanism 91 (e.g., a robot) transfers one or more wafers at a time, or transfers the entire wafer carrier, from the second load port 81 to either the first load lock 83 or the second load lock 85 of the fabrication tool 87. Within the fabrication tool 87 wafers are transferred from the first load lock 83 or the second load lock 85 to one or more process chambers 86 (see FIG. 10) for processing. Alternatively, the first elevator 75 and/or the second elevator 79 may transfer a wafer carrier to the overhead factory transfer system 89, and/or the bi-level conveyor 103 may transfer a wafer carrier directly to the load buffer of a locally connected fabrication tool.

Figure 10:
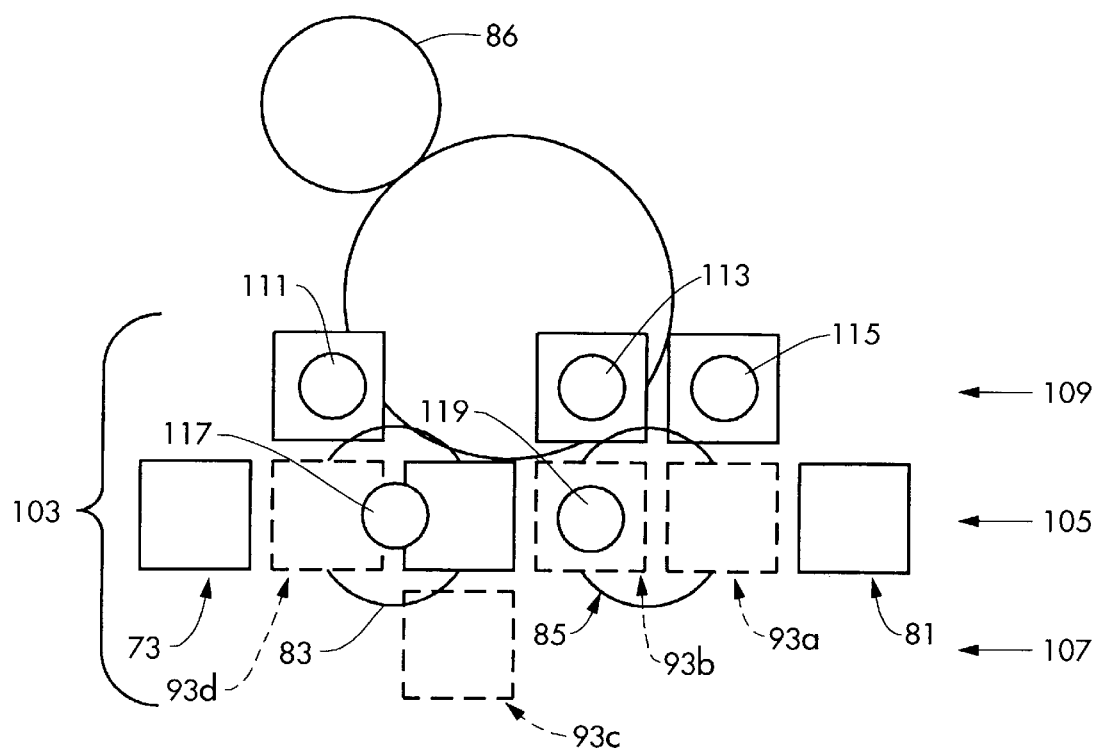
FIG. 10 is a top plan view of a conveyor-type load buffer, which employs the horizontally oriented dual-compartment segment of FIG. 7B.

FIG. 10 is a top plan view of a conveyor-type load buffer 71, which employs the horizontally oriented dual-compartment segment 93 of FIG. 7B. As shown in FIG. 10 the dual-compartment segment 93c is neutrally positioned (i.e., the first compartment 95 occupies the move channel 105 and the second compartment 97 occupies the shuttle channel 107) and the dual-compartment segments 93a, 93b and 93d are positively positioned (i.e., with the first compartment 95 occupying the storage channel 109 and the second compartment 97 occupying the shuttle channel 107).

In the example of FIG. 10 a first wafer carrier 111 is stored by dual-compartment segment 93d, a second wafer carrier 113 is stored by dual-compartment segment 93b, and a third wafer carrier 115 is stored by dual-compartment segment 93a. A fourth wafer carrier 117 and a fifth wafer carrier 119 are moving through the move channel 105. The fourth wafer carrier 117 is moving from the first compartment 95 of the dual-compartment segment 93c to the first compartment 95 of the dual-compartment segment 93d, and the fifth wafer carrier 119 is moving through the first compartment 95 of the dual-compartment segment 93b. As this example shows, a single dual-compartment segment 93 may contain wafer carriers in both the first compartment 95 and in the second compartment 97 at any given time, as does dual-compartment segment 93b. Also as this example shows, at any given time the move channel 105 may comprise either the first compartment 95 or the second compartment 97 of a given dual-compartment segment 93.

As with the vertically oriented bi-level conveyor 103 of FIG. 8, in the preferred operation of FIG. 10, each dual-compartment segment 93 is initially neutrally positioned, a first wafer carrier is then loaded into the first compartment 95 of the dual-compartment segment 93a and can: 1) travel immediately along the move channel 105 to the end of the bi-level conveyor 103 where the first wafer carrier will be unloaded from the bi-level conveyor 103 and placed within the second elevator 79 (see FIG. 11); 2) travel a distance along the bi-level conveyor 103 (e.g., to dual-compartment segment 93b, 93c or 93d) and then be placed in storage (e.g., placed in the storage channel 109 by shifting the respective dual-compartment segment 93 to a positive position); or 3) immediately be placed in storage (e.g., by shifting dual-compartment segment 93a to a positive position).

To remove a wafer carrier from storage and return it to the move channel 105, the dual-compartment segment 93 containing the wafer carrier is shifted from the positive position to the neutral position. Thereafter, the wafer carrier may continue traveling along the move channel 105. Thus, by employing a dual-compartment conveyor 103 and by designating one channel for storage and one channel for movement, a first wafer carrier may be placed in storage at any point along the bi-level conveyor 103 (i.e., within any of the plurality of dual-compartment segments 93a–d) without obstructing the passage of a second wafer carrier through the move channel 105. Although the move channel 105 is preferably used only for moving wafer carriers, and the storage channel 109 is preferably used only for storing wafer carriers, the storage channel 109 and/or the move channel 105 may perform a combination of storage and movement functions. Although the load buffer 71 of FIG. 10 is positioned above a fabrication tool, a person of ordinary skill in the art will recognize that it may be positioned for example, in front of, or beside, a fabrication tool.

Figure 11:
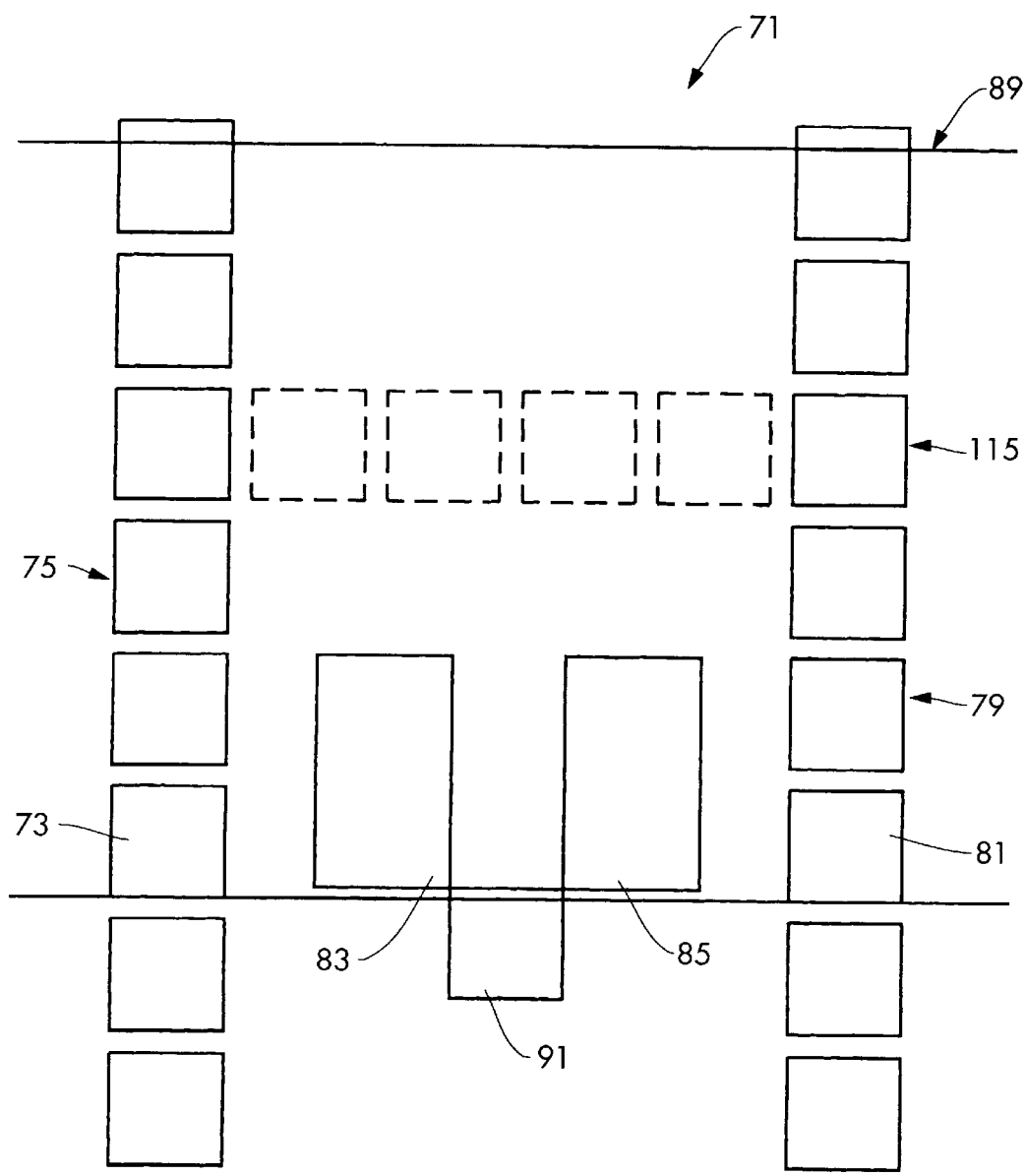
FIG. 11 is a side elevational view of a horizontally oriented conveyor-type load buffer, taken along line 1—1 of FIG. 10.

FIG. 11 is a side elevational view of the conveyor-type load buffer 71, taken along line 1—1 of FIG. 10. Thus, while FIG. 11 shows only the move channel 105—the shuttle channel 107 and the storage channel 109 are in the plane perpendicular to the page. Except for the horizontal orientation of the bi-level conveyor 103 (described with reference to FIG. 10), the configuration and operation of the load buffer 71 shown in FIG. 11 is the same as that described with reference to FIG. 9, further description is therefore omitted.

As previously stated, the load buffer embodiments described above are merely the currently preferred embodiments. Other embodiments will likewise benefit from the inventive features taught herein, such as the local interconnection of fabrication tools, the ability to receive wafer carriers from overhead factory transport mechanisms, the ability for the factory load port and the tool load port to operate independently, etc.

Similarly, an inventive method of wafer handling is now provided which is particularly advantageous when employed with the interconnected conveyor-type load buffers shown in FIG. 6C. However, it should be noted that the inventive method can be advantageously employed within any fabrication system that employs a plurality of tools for simultaneously performing a process (preferably the same process), as better understood with reference to FIG. 12.

Figure 12:
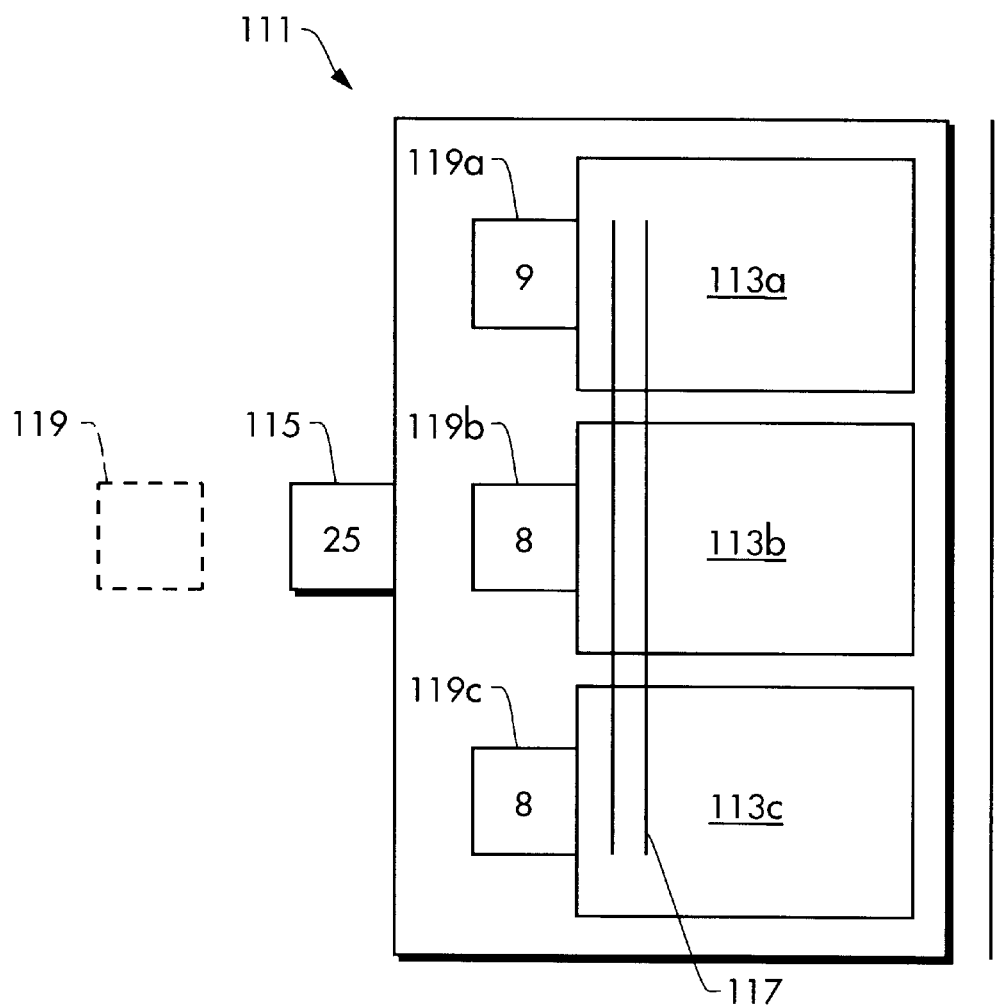
FIG. 12 is a top plan view of a fabrication system that is useful in describing an inventive wafer handling method.

FIG. 12 is a top plan view of a tool set 111 that is useful in describing an inventive wafer handling method. The tool set 111, as an example, comprises three fabrication tools 113a–c each of which performs the same process. Although the inventive method is most advantageously employed with a set of tools that perform the same process, it may also be employed with a set of tools that perform various different processes.

In its broadest sense, the inventive method comprises receiving a wafer carrier containing a plurality of wafers (i.e., a wafer lot), at a fabrication tool, or at an incoming wafer carrier location 115 of the tool set 111, dividing the wafer lot into a plurality of sublots and delivering these sublots to a plurality of the tools within the tool set 111. In this manner, the plurality of tools may begin processing shortly after receipt of the first wafer lot. The sublots may be delivered to the tools 113a–c via the same mechanism (e.g., factory transport) which delivered the lot, or may be delivered via a local transfer mechanism (represented generally by the number 117) such as a local connection of load buffers (e.g., those pictured in FIG. 6C). The wafer lot is preferably divided equally between the number of tools in the set. Thus, as shown in FIG. 12 a 25 wafer lot is received at incoming wafer carrier location 115, and is divided into a 9 wafer sublot and two 8 wafer sublots, and placed in three previously empty carriers 119a–c, which are delivered via local transfer mechanism 117 to the fabrication tools 113a–c.

The present invention preferably provides a control program generally represented by the number 119 which may be stored in any computer readable medium (e.g., a hard disc, floppy disc, carrier wave signal, etc.). The control program may be part of the overall program that controls manufacturing execution and material control, or may be a separate program. When a separate program and an incoming wafer carrier location 115 are employed, both the manufacturing execution/material control program and the wafer handling equipment can be significantly simplified, as fewer locations (in this example a third of the locations) will need to be accessed thereby.

Figure 13:
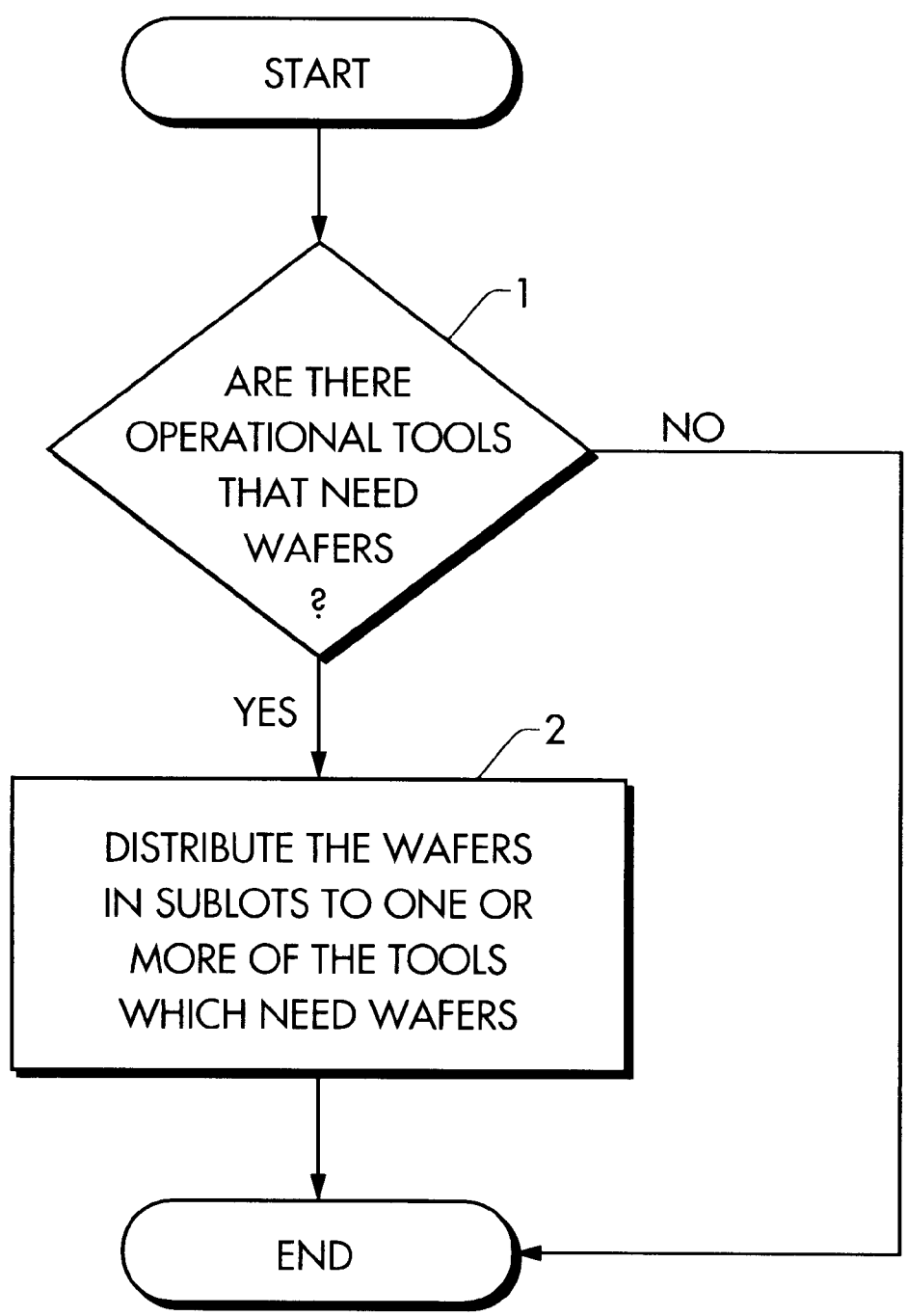
FIG. 13 is a flow diagram useful in describing the inventive wafer handling method.

A control program for carrying out the inventive method is set forth in FIG. 13. As described by FIG. 13, a controller checks to see if any of the fabrication tools in the set are operational (e.g., not broken, etc.) and are in need of wafers (block 1). If an operational tool or tools exist and are in need of wafers, wafers waiting to be loaded into other tools are distributed in sublots to one or more of the tools which need wafers (block 2). Preferably the wafers are redistributed optimally, according to an algorithm, (e.g., as close to equally as possible) among the tools in the set. Any mechanism may be used to divide the wafers into sublots and redistribute the wafers, such as the fabrication tool's front end loader robot, etc. Empty wafer carriers may be in storage waiting for sublot formation. After processing is complete, the sublots may be recombined (e.g., by the loader robot) or may proceed to the next equipment set in sublots.

The inventive method allows a tool set to assume steady state processing in a fraction (in this example approximately one third) the time that is required by conventional methods, and is therefore advantageous during any transient processing condition (startup, tool failure, etc.)

The foregoing description discloses only the preferred embodiment of the invention, modification of the above disclosed apparatus and method which fall within the scope of the invention will be readily apparent to those of ordinary skill in the art. For instance, although only four storage locations 25a, 25b, 25c and 25d are shown, additional storage locations could be provided. Although each of the storage locations 25a, 25b, 25c and 25d is shown as being wide enough to hold only a single wafer carrier, the size of the storage locations may vary so as to hold a plurality of wafer carriers. As well, the specific apparatus employed as the first and second vertical transfer mechanism may vary, as may the specific location and coupling of components.

Although the dual-compartment segment 93 is shown as having only a first compartment 95 and a second compartment 97, the dual-compartment segment 93 may have additional compartments which could provide additional storage locations or additional movement channels. Although each dual-compartment segment 93 is shown as being wide enough to hold only a single wafer carrier, the size of dual-compartment segment 93 may vary.

In operation, any channel may perform both storage and movement at a given time, and the first and second load ports may each function as both a factory load port and a tool load port. The horizontal transfer mechanism is not limited to the conveyor system disclosed. Other equivalent transfer mechanisms will be apparent to those of ordinary skill in the art. Although a horizontal transfer mechanism that comprises both a storage and a move channel is preferred, the horizontal transfer mechanism may comprise a single channel. Preferably the first and second load ports will conform to the specifications set forth in SEMI—E15, however, other load ports could be used.

The load buffer apparatus is described as transferring wafer carriers, however, it should be understood that the invention is not limited thereto, and wafers may be transferred individually, and/or in SMIF or other type pods, etc. The pods need not be of the bottom opening type, for instance, side or top opening pods may be employed within the inventive system. If used for transferring SMIF or other type pods the load buffer of the present invention preferably would include a mechanism for opening and closing the pod at the tool load port, such as those conventionally known in the art.

Finally, although FIG. 12 shows the equipment set as comprising a plurality of adjacent tools, the inventive method can be used with equipment sets that are not adjacent, and are not locally connected. The tool sets may comprise any number of tools; the three tools of FIG. 12 are merely exemplary.

Accordingly, while the present invention has been disclosed in connection with the preferred embodiments thereof, it should be understood that other embodiments may fall within the spirit and scope of the invention, as defined by the following claims.

What is claimed is:

1. A load/buffer adapted to provide local storage of wafer carriers at a fabrication tool, comprising:

a first factory load port adapted to receive wafer carriers to be transferred to and from the factory;

a wafer carrier store including at least one first storage location positioned above a first load lock of the fabrication tool and at least one second storage location positioned above a second load lock of the fabrication tool;

a first wafer carrier transfer mechanism adjacent the first factory load port and the wafer carrier store and adapted to transfer wafer carriers between the factory load port and the store;

a first tool load port adapted to receive wafer carriers to be accessed by a fabrication tool; and a second wafer carrier transfer mechanism adjacent the first tool load port and the wafer carrier store and adapted to transfer wafer carriers between the tool load port and the store.

2. The apparatus of claim 1 wherein the factory load port is adapted to receive wafer carriers to be transferred to and from the tool, and the tool load port is adapted to receive wafer carriers to be transferred to and from the factory.

3. The apparatus of claim 1 wherein the store comprises a conveyor.

4. The apparatus of claim 3 wherein the conveyor comprises a modular bi-level conveyor.

5. The apparatus of claim 3 wherein the first wafer carrier transfer mechanism comprises an elevator, and the second wafer carrier transfer mechanism comprises an elevator.

6. A load/buffer system, comprising:

a pair of the load/buffer as claimed in claim 3;

wherein at least one of the wafer carrier transfer mechanisms of the pair is adapted to access the at least one shelf of each of the pair.

7. The apparatus of claim 1 wherein the store comprises at least one shelf.

8. The apparatus of claim 7 wherein the first wafer carrier transfer mechanism comprises a robot arm, and the second wafer carrier transfer mechanism comprises a robot arm.

9. The apparatus of claim 1 wherein the store comprises a plurality of vertically spaced shelves.

10. The apparatus of claim 1 further comprising:

a second factory load port adapted to receive wafer carriers to be transferred to and from the factory; and a second tool load port adapted to receive wafer carriers to be accessed by a tool;

wherein the first wafer carrier transfer mechanism is adapted to access both the first and the second factory load ports, and the second wafer carrier transfer mechanism is adapted to access both the first and the second tool load ports.

11. The apparatus of claim 1 wherein the first wafer carrier transfer mechanism is adapted to extract and place wafer carriers to and from the first factory load port from a position generally vertically aligned with the first factory load port.

12. The apparatus of claim 11 wherein the second wafer carrier transfer mechanism is adapted to extract and place wafer carriers to and from the second tool load port from a position generally vertically aligned with the second tool load port.

13. The apparatus of claim 1 wherein the second wafer carrier transfer mechanism is adapted to extract and place wafer carriers to and from the first tool load port from a position generally vertically aligned with the first tool load port.

14. An apparatus comprising:

a fabrication tool the load/buffer of claim 1 wherein the tool load port is located on top of the fabrication tool.

15. The apparatus of claim 14 wherein the fabrication tool comprises a top opening load lock having a top.

16. The apparatus of claim 15 wherein the top opening load lock comprises a pod engaging mechanism adapted to elevate a wafer carrier cover as the top of the top opening load lock elevates.

17. The apparatus of claim 16 wherein the top opening load lock comprises a wafer extraction mechanism adapted to extract at least one wafer from an open wafer carrier positioned on the first tool load port.

18. A load/buffer system, comprising:

a pair of the load/buffer as claimed in claim 1;

wherein at least one of the wafer carrier transfer mechanisms of the pair is adapted to transfer a wafer carrier to the store of the second load/buffer.

19. The apparatus of claim 1 wherein the first wafer carrier transfer mechanism is adapted to transport wafer carriers linearly between the factory load port and the store, and the second wafer carrier transfer mechanism is adapted to transport wafer carriers linearly between the store and the tool load port.

20. A load/buffer adapted to provide local storage of wafer carriers at a fabrication tool, comprising:

a first factory load port means adapted to receive wafer carriers to be transferred to and from the factory;

a wafer carrier storage means including at least one first storage location positioned above a first load lock of the fabrication tool and at least one second storage location positioned above a second load lock of the fabrication tool;

a first wafer carrier transfer means adjacent the first factory load port means and the wafer carrier storage means and adapted to transfer wafer carriers between the factory load port means and the storage means;

a first tool load port means for receiving wafer carriers to be accessed by a tool; and a second wafer carrier transfer means adjacent the first tool load port means and the wafer carrier storage means and adapted to transfer wafer carriers between the tool load port means and the storage means.

21. A load/buffer system comprising:

a pair of the load/buffer as claimed in claim 20;

wherein each of the pair includes a conveyor, and each of the conveyors are connected.

22. A load/buffer system comprising:

a pair of the load/buffer as claimed in claim 20;

wherein each of the pair includes a conveyor, and each of the conveyors are directly connected.

23. A storage system comprising:

a storage apparatus adapted to store wafer carriers locally at a fabrication tool, the storage apparatus comprising a pair of load ports, a pair of wafer carrier transfer mechanisms adjacent the load ports and, at least one first storage location positioned above a first load lock of the fabrication tool and at least one second storage location positioned above a second load lock of the fabrication tool;

wherein the pair of wafer carrier transfer mechanisms are adapted to move a wafer carrier between the pair of load ports and the at least one first storage location and the at least one second storage location;

wherein each of the pair of load ports is adapted to receive a wafer carrier to be stored in the storage apparatus, and to receive a wafer carrier having been stored in the storage apparatus, such that each of the pair of load ports functions as both a factory load port and a tool load port.

24. A storage system comprising:

a storage means adapted to store wafer carriers locally at a fabrication tool, the storage means comprising a pair of load port means, a pair of wafer carrier transfer means adjacent the pair of load port means, and at least one first storage location positioned above a first load lock means of the fabrication tool and at least one second storage location positioned above a second load lock means of the fabrication tool;

wherein the pair of wafer carrier transfer means are adapted to move a wafer carrier between the pair of load port means and the at least one first storage location and the at least one second storage location;

wherein each of the pair of load port means is adapted to receive a wafer carrier to be stored in the storage means, and to receive a wafer carrier having been stored in the storage means, such that each of the pair of load port means functions as both a factory load port and a tool load port.

* * * * *